(12) United States Patent
Iriguchi

(10) Patent No.: US 7,443,234 B2
(45) Date of Patent: Oct. 28, 2008

(54) DIFFERENTIAL AMPLIFIER, DIGITAL-TO-ANALOG CONVERTER AND DISPLAY DEVICE

(75) Inventor: Masao Iriguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 28 days.

(21) Appl. No.: 11/689,340

(22) Filed: Mar. 21, 2007

(65) Prior Publication Data
US 2007/0236289 A1 Oct. 11, 2007

(30) Foreign Application Priority Data
Mar. 23, 2006 (JP) .............................. 2006-081344

(51) Int. Cl.
*H03F 1/02* (2006.01)
*H03F 3/45* (2006.01)

(52) U.S. Cl. .......................... 330/9; 330/253; 330/257; 330/258

(58) Field of Classification Search ................ 330/9, 330/253, 257, 258, 260
See application file for complete search history.

(56) References Cited

U.S. PATENT DOCUMENTS

| | | | |
|---|---|---|---|
| 6,388,653 B1 | 5/2002 | Goto et al. | |
| 6,448,836 B2 | 9/2002 | Kokubun et al. | |
| 6,586,990 B2 * | 7/2003 | Udo et al. | 330/9 |
| 7,081,792 B2 * | 7/2006 | Kasai et al. | 330/9 |
| 7,116,161 B2 | 10/2006 | Nakahira | |
| 7,368,983 B2 * | 5/2008 | Nishimori | 330/9 |

FOREIGN PATENT DOCUMENTS

| | | |
|---|---|---|
| JP | 11-249624 A | 9/1999 |
| JP | 2001-292041 A | 10/2001 |
| JP | 2005-110065 A | 4/2005 |

* cited by examiner

*Primary Examiner*—Khanh V Nguyen
(74) *Attorney, Agent, or Firm*—Sughre Mion, PLLC

(57) ABSTRACT

Disclosed are a multi-level differential amplifier that includes first to third input terminals; an output terminal; first to third differential pairs; a current source circuit for supplying currents to the respective first to mth differential pairs; a load circuit connected to first and second nodes to which first and second outputs of each of output pairs of the first to third differential pairs are connected in common; an amplifier stage receiving a signal from at least one node of the first and second nodes as an input and having its output connected to the output terminal; and a capacitance element. A data output period includes first and second periods. In the first period, responsive to a control signal, a first input of each input pair of the first to third differential pairs is made a non-inverting input, the second input is made an inverting input, the first inputs are connected to the respective first to third input terminals, and the second inputs of the first to third differential pairs are connected in common with one end of the capacitance element and with the output terminal. In the second period, responsive to a control signal, the first input of each input pair of the first to third differential pairs is made an inverting input and the second input is made a non-inverting input, the first inputs of each of the input pairs are connected in common with the output terminal, and the second inputs are connected in common with the one end of the capacitance element.

29 Claims, 30 Drawing Sheets

CIRCUIT CONNECTIONS IN PERIOD T02

RELATIONSHIP BETWEEN INPUT AND OUTPUT LEVELS

| OUTPUT LEVEL | INPUT VOLTAGE | Vin1 | Vin2 | D1,D0 |
|---|---|---|---|---|
| Vo1 | A | A | A | 0,0 |
| Vo2 |   | A | B | 0,1 |
| Vo3 |   | B | A | 1,0 |
| Vo4 | B | B | B | 1,1 |

RELATIONSHIP OF VOLTAGE SELECTION STATES ASSOCIATED WITH 2-BIT DIGITAL DATA (D1,D0)

OUTPUT RESULT WITHOUT THRESHOLD-VALUE DEVIATIONS IN DIFFERENTIAL PAIRS
Vthn11a−Vthn11b=Vthn12a−Vthnb12b=Vthn2a−Vthn2b= 0 V OUTPUT RESULT WITH THRESHOLD-VALUE DEVIATIONS IN DIFFERENTIAL PAIRS
Vthn11a−Vthn11b=Vthn12a−Vthn12b=Vthn2a−Vthn2b=−200mV OUTPUT RESULT WITHOUT THRESHOLD-VALUE DEVIATIONS IN DIFFERENTIAL PAIRS
Vthn1a−Vthnb1b=Vthn2a−Vthn2b= 0 V OUTPUT RESULT WITH THRESHOLD-VALUE DEVIATIONS IN DIFFERENTIAL PAIRS
Vthn1a−Vthn1b=Vthn2a−Vthn2b=−200mV OUTPUT RESULT WITHOUT THRESHOLD-VALUE DEVIATIONS IN DIFFERENTIAL PAIRS
Vthn1a-Vthnb1b=Vthn2a-Vthn2b=Vthn3a-Vthn3b= 0 V OUTPUT RESULT WITH THRESHOLD-VALUE DEVIATIONS IN DIFFERENTIAL PAIRS
Vthn1a-Vthn1b=Vthn2a-Vthn2b=Vthn3a-Vthn3b=-200mV

PMOS SWITCH CIRCUIT

NMOS SWITCH CIRCUIT

CMOS SWITCH CIRCUIT

US 7,443,234 B2

DIFFERENTIAL AMPLIFIER, DIGITAL-TO-ANALOG CONVERTER AND DISPLAY DEVICE

FIELD OF THE INVENTION

This invention relates to a differential amplifier, digital-to-analog converter and display device. More particularly, the invention relates to a multi-level-output differential amplifier that is ideal for offset cancellation.

BACKGROUND OF THE INVENTION

A configuration of the kind illustrated in FIG. 1 is in use as a data driver for driving the data lines of a liquid crystal display device. Referring to FIG. 1, this conventional data driver includes a shift register 209, data register 208, data latch 207, level shifter 206, grayscale voltage generating circuit 205, decoders 203 and output circuit 202 (amplifiers 201).

The operation of the conventional data driver shown in FIG. 1 will now be described. The shift register 209 outputs shift pulses responsive to a clock signal CLK, and the data register 208 successively up-shifts input video data DATA_IN responsive to the shift pulses from the shift register 209 and delivers the video data in accordance with the number of outputs. The data latch 207 latches the video data delivered by the data register 208 and delivers all of its outputs to the level shifter 206 in unison responsive to the timing of a control signal STB.

The level shifter 206 outputs a signal that is a digital video signal. The digital video signal is converted to an analog grayscale voltage by the circuitry from the decoders 203 to the output circuit 202. The grayscale voltage generating circuit 205 comprises a resistor string including a plurality of resistance elements connected between a power supply VA and a power supply VB, and grayscale voltages the number whereof is equivalent to the number of gray levels are output to the decoders 203 from respective terminals (taps) of the resistor string. Each of the decoders 203 receives each of the grayscale voltages as well as the digital video signal as inputs, selects the grayscale voltage that corresponds to the digital video signal and outputs this grayscale voltage to the output circuit 202. The output circuit 202 amplifies and outputs the grayscale voltages and delivers the amplified voltages to an output terminal group 210. Each output terminal is connected to one end of a data line (not shown) for supplying the grayscale voltage to the pixels of a display device.

The decoders 203 and amplifiers 201, each pair for outputting a grayscale voltage corresponding to the digital video signal, are provided in a number equivalent to the number of outputs. A plurality of decoders 203 commonly receives grayscale voltages output from the grayscale voltage generating circuit 205 through grayscale voltage lines, thereby each grayscale voltage being shared by entire outputs.

In other words, a digital-to-analog converting circuit block is composed by the group of decoders 203, grayscale voltage generating circuit 205 and output circuit 202.

Generally, since the data lines of a liquid crystal display device constitute a large capacitive load, operational amplifiers are used as the amplifiers 201 employed in the output circuit 202. For example, an operational amplifier of the kind shown in FIG. 2, comprises a differential-stage amplifying circuit 901 and an output-stage amplifying circuit 903. The differential-stage circuit 901 includes: a differential pair comprising NMOS transistors M3 and M4; a current mirror circuit comprising PMOS transistors M1 and M2; and an NMOS transistor M9 that acts as a constant-current source upon application of a constant bias voltage to its gate terminal. In the example shown in FIG. 2, the output-stage amplifying circuit 903 is constructed as a source-grounded active-load amplifying circuit and comprises a PMOS transistor M7 for receiving and amplifying an output signal from an output point PA of differential-stage circuit 901, and an NMOS transistor M10 that acts as a constant-current source.

Because the node PB and the gate input of the NMOS transistor M3 are connected to form negative feedback, the voltage at the output end (the voltage at an output point PB) stabilizes at a potential at which equilibrium is achieved between the drain current of the PMOS transistor M7 of the output-stage amplifying circuit, which current flows in accordance with the amplified output signal of the differential stage, and the drain current of the NMOS transistor M10 of the constant-current source.

However, a problem which arises with an operational amplifier is the occurrence of output offset that is mainly ascribable to a variation in the characteristics of active elements. The cause of this variation in characteristics is a variation in the oxide film or in the impurity concentration of the MOS transistors, or a variation in element size (W/L, where W and L are channel width and channel length, respectively). These variations in fabrication are decided by the quality of the fabrication process and represent a problem that cannot be avoided.

Generally, offset voltage ascribable to a variation in the transistor characteristics of a differential circuit is proportional to $1/\sqrt{S}$, where S represents the gate area of the transistor. In order to reduce the offset voltage, therefore, the gate area must be made fairly large. This leads to an increase in chip area. In addition, if the offset voltage itself is large, there is a limit upon the increase in gate area.

In order to solve this problem, use is made of a circuit (an offset-canceling amplifier) for correcting output offset.

A circuit disclosed in Patent Document 1 (Japanese Patent Kokai Publication No. JP-A-11-249624) will be described as a first example of conventional art for correcting output offset. FIG. 3 illustrates the configuration of a high-voltage amplifier circuit (charging amplifier circuit) shown in Patent Document 1, and FIG. 4 illustrates the configuration of a low-voltage amplifier circuit shown in Patent Document 1.

The high-voltage amplifier shown in FIG. 3 includes switching PMOS transistors PB1 and PA1 that connect the gate of an input-stage NMOS (Nch-MOS) transistor NM16 to a (+) or (−) input terminal, and switching PMOS transistors PA2 and PB2 that connect the gate of an input-stage NMOS transistor NM62 to the (+) or (−) input terminal. The high-voltage amplifier further includes switching PMOS transistors PB3 and PA3 that connect the gate electrode of an output-stage PMOS (Pch-MOS) transistor PM56 to the drain of the input-stage NMOS transistor NM61 or NM62. Further, switching PMOS transistors PA4, PB4 are provided for connecting the gates of a PMOS transistor PM53 and PMOS transistor PM54, which form a load circuit, to the drain of the input-stage NMOS transistor MN61 or MN62.

The low-voltage amplifier shown in FIG. 4 has a configuration in which the PMOS and NMOS transistors of the high-voltage amplifier illustrated in FIG. 3 are interchanged. That is, the low-voltage amplifier shown in FIG. 4 includes switching NMOS transistors NB1, NA1 that connect the gate of an input-stage PMOS transistor PM51 to a (+) or (−) input terminal, and switching PMOS transistors NA2 and NB2 that connect the gate of an input-stage PMOS transistor PM52 to the (+) or (−) input terminal. The low-voltage amplifier further includes switching NMOS transistors NB3 and NA3 that connect the gate electrode of an output-stage NMOS transistor NM65 to the drain of the input-stage NMOS transistor PM51 or PM52. Further, switching PMOS transistors NA4 and NB4 are provided for connecting the gates of an NMOS transistor NM63 and NMOS transistor NM64, which form a load circuit, to the drain of the input-stage PMOS transistor PM51 or PM52.

A control signal A is applied to the gates of the switching PMOS transistors PA1 to PA4 and switching NMOS transistors NA1 to NA4, and a control signal B is applied to the gates of the switching PMOS transistors PB1 to PB4 and switching NMOS transistors NB1 to NB4.

The operation of the circuit shown in FIG. 3 will now be described. First, if the control signal A is at the H (high) level and the control signal B is at the L (low) level, the switching PMOS transistors PA1 to PA4 are placed in an OFF (non-conductive) state and the switching PMOS transistors PB1 to PB4 are placed in an ON (conductive) state. Owing to the state of the circuit connections at this time, the gate of the NMOS transistor NM61 is made a non-inverting input, the gate of the NMOS transistor NM62 is made an inverting input, the (+) input terminal is connected to the gate of the NMOS transistor NM61 and the (−) input terminal is connected to the gate of the NMOS transistor NM62.

The output voltage Vout at this time is Vin+Voffh, where Vout is the output voltage, Vin is the input voltage and Voffh is the offset voltage of the high-voltage amplifier. The offset is superimposed on the amplified voltage.

Further, if the control signal A is at the L (low) level and the control signal B is at the H (high) level, the switching PMOS transistors PA1 to PA4 are placed in an ON (conductive) state and the switching PMOS transistors PB1 to PB4 are placed in an OFF (non-conductive) state. Owing to the state of the circuit connections at this time, the gate of the NMOS transistor NM61 is made an inverting input, the gate of the NMOS transistor NM62 is made a non-inverting input, the (−) input terminal is connected to the gate of the NMOS transistor NM61 and the (+) input terminal is connected to the gate of the NMOS transistor NM62.

The output voltage Vout at this time is Vin−Voffh.

Similarly, with regard to operation of the circuit shown in FIG. 4, the polarity of the offset voltage can be made reversible between plus and minus by control whereby the non-inverting input transistor and the inverting input transistor are interchanged by the control signals A and B. That is, if the control signals A and B are at the H and L levels, respectively, the switching NMOS transistors NA1 to NA4 assume an ON state and the switching NMOS transistors NB1 to NB4 assume an OFF state. At this time the gate of the PMOS transistor PM51 is connected to the inverting input (− input terminal) and the gate of the PMOS transistor PM52 to the non-inverting input (+ input terminal). Further, if the control signals A and B are at the L and H levels, respectively, the switching NMOS transistors NA1 to NA4 assume an OFF state and the switching NMOS transistors NB1 to NB4 assume an ON state. At this time the gate of the PMOS transistor PM51 is connected to the non-inverting input (+ input terminal) and the gate of the PMOS transistor PM52 to the inverting input (− input terminal).

The output offset is primarily caused by a variation in characteristics of the differential-pair transistors (NM61, NM62) or (PM51, PM52). The output offset due to the variation in characteristics is unavoidable even if the characteristics of the two transistors constituting the differential pair are designed to be exactly the same. An explanation relating to offset in a differential stage is also set forth in paragraph [0049] of Patent Document 1.

As illustrated above, the amplifier described in Patent Document 1 is such that by reversing the relationship between the H and L levels of the control signals A and B, output offsets that are opposite in sign from each other but equal in absolute value can be produced at the output of the amplifier circuit.

From the standpoint of display quality and prolongation of liquid crystal service life, liquid crystal display devices frequently employ dot inversion drive. When dot inversion drive is used, the positive and negative polarities of applied grayscale voltage become the opposite of each other between mutually adjacent pixels and between mutually adjacent data lines. Accordingly, if a high-voltage amplifier is used to apply a grayscale voltage of positive polarity and a low-voltage amplifier is used to apply a grayscale voltage of negative polarity, two amplifiers are used and are switched between alternatingly frame by frame per pixel. Furthermore, by changing over the relationship between the H level and L level of the control signals A, B every two frames, the output offset is averaged over time in a case where a unit of four frames is observed. As a result, a decline in image quality due to output offset is suppressed.

Although the method of suppressing offset described in Patent Document 1 excels in that no use is made of capacitance, the fact that the absolute value of offset cannot be reduced is a problem. Whereas the video signal changes every data output period and changes every frame unit as well, four frames are required in order to cancel out offset. In the case of a circuit formed by TFTs (thin-film transistors) for which the absolute value of the offset is large, there is a limitation upon the offset suppressing effect afforded by Patent Document 1.

A method of reducing the absolute value of output offset disclosed in Patent Document 2 (Japanese Patent Kokai Publication No. JP-P2005-110065A) will be described as a second example of conventional art. FIG. 5 illustrates a high-voltage amplifier circuit (charging amplifier circuit) shown in Patent Document 2, and FIG. 6 illustrates a switch-control timing chart of the amplifier circuit shown in Patent Document 2.

As illustrated in FIG. 5, the circuit comprises: a differential input section 101 comprising NMOS transistors (input transistors) 111 and 112 whose sources are tied together; a constant-current source 121 connected between the commonly connected sources of the transistors 111 and 112 and a low-potential power source VSS; an active load 102 connected to drains of the NMOS transistors 111 and 112; a switch 10 connecting an input terminal 1 and the gate of the NMOS transistor 111; a capacitance element 5 connected between the gate of NMOS input transistor 112 and a power source V0 (where V0 is an any power source); a driving and output stage 103 connected to an output terminal 2; a switch 11 connecting the output terminal 2 and the gate of the NMOS transistor 112; a switch 13 connecting the output terminal 2 and the gate of the NMOS transistor 111; a switch 12 connecting a drain of the NMOS transistor 111 and the driving and output stage 103; and a switch 14 connecting a drain of the NMOS transistor 112 and the driving and output stage 103.

Next, the operation of the circuit illustrated in FIG. 5 will be described using the switch-control timing chart of FIG. 6. One data output period TDATA is a period in which one signal is output and comprises an offset detection period T01 and an offset-compensated output period T02. The offset detection period T01 is a period for detecting an output voltage that includes offset, and the offset-compensated output period T02 is a period for performing an output operation in which offset has been compensated for based upon a voltage that has been detected and held.

In the offset detection period T01, the switches 10, 11 and 12 are set in an ON state and the switches 13, 14 are set in an OFF state. At this time the gate of the NMOS transistor 111 becomes a non-inverting input and the gate of the NMOS transistor 112 becomes an inverting input. Since the input voltage VIN is amplified and output by voltage-follower operation, the output voltage Vout becomes Vin+Voff (where Voff is the offset voltage). The output potential is held in capacitor 5 at this time.

In the offset-compensated output period T02, the switches 10, 11, 12 are set in an OFF state and the switches 13, 14 are set in an ON state. At this time the gate of the NMOS transistor 111 becomes an inverting input and the gate of the NMOS transistor 112 becomes a non-inverting input. Amplification and output are performed with the potential (Vin+Voff) held in the capacitor 5 serving as the input voltage. In time period T01, the relationship between the polarities of the non-inverting and inverting inputs of the differential pair is the opposite of that in time period T01. Therefore, since the voltage −Voff is output with respect to the input voltage, the output potential Vout at the end of period T02 becomes equal to Vin. As a result, the absolute value of the offset can be corrected to a small value.

A method of reducing the absolute value of output offset disclosed in Patent Document 3 (Japanese Patent Kokai Publication No. JP-P2001-292041A) will be described as a third example of conventional art. FIG. 7 illustrates a high-voltage amplifier circuit (charging amplifier circuit) shown in Patent Document 3, and FIG. 8 illustrates a switch-control timing chart of the amplifier circuit shown in Patent Document 3.

The operation of the offset canceling amplifier set forth in Patent Document 3 will be described with reference to the circuit configuration shown in FIG. 7 and the timing chart depicted in FIG. 8.

In offset detection period T01 constituting one data output period TDATA, switches S1 and S3 are set in an ON state and switch S2 is set in an OFF state. At this time, voltage Vin supplied to input terminal VIN is applied to both transistors of the differential pair (M3, M4). The differential pair (M3, M4) therefore acts as a current source with respect to a current mirror circuit (M1, M2). Further, in the differential pair (MS, M6), the input terminal VIN is connected to the gate of transistor M6 and output terminal VOUT is connected to the gate of transistor MS. The voltage Vout of the output terminal VOUT at this time is stabilized by negative feedback at a voltage (Vin+Voff) that includes offset voltage Voff ascribable to a variation in the characteristics of the transistors in the differential circuit. Since capacitor C1 is connected to the gate of transistor MS, the potential of Vout in the stable state is set in the capacitor C1 at this time.

Next, in offset-compensated output period T02, switches S1 and S3 are set in an OFF state and switch S2 is set in an ON state. The voltage that is applied to the differential pair (M5, M6) at this time remains the same as that in the offset detection period T01. Further, the input terminal VIN remains connected to the gate of transistor M4, and the output terminal VOUT is connected for negative feedback to the gate of transistor M3. As a result, the output voltage Vout stabilizes at a potential that retains the same state as that in the offset detection period T01. That is, in period T02, the output voltage Vout becomes the input voltage Vin and the offset is corrected.

In the first period (offset detection period) according to the method set forth in Patent Document 2, V1 and V1+Voff (=Vout) are applied to the non-inverting input and inverting input. In the second period (offset compensation interval), the relationship between the non-inverting input and inverting input is reversed and V1 (=Vout), V1+Voff1 (=VC1) are applied to the inverting input and non-inverting input. At this time operation is such that the input voltages at the gates of the two transistors of the differential pair and the common source potential are held at the same potentials in the first and second periods, thereby enabling correction of the offset.

Further, in the first period (offset detection period) according to the method set forth in Patent Document 3, Vin+Voff (=Vout) and Vin are applied to the gates of the differential pair (M5, M6), respectively, and Vin is applied in common to the gates of the differential pair (M3, M4). In the second period (offset compensation period), Vin+Voff (=VC1) and Vin are applied to the gates of the transistor pair (M5, M6), respectively, and Vin (=Vout) is applied in common to the gates of the transistor pair (M3, M4). Accordingly, operation is such that the same differential voltage and differential current are held in the first and second periods, and therefore offset can be corrected.

As described above, the methods illustrated in Patent Documents 2 and 3 hold the voltages and currents of the gates of the differential pairs in the first period using a capacitor and change over the connection of the output terminal in the second period, as a result of which operation is such that the voltage input state of the first period is held, thereby making it possible to correct the absolute value of the offset.

[Patent Document 1] Japanese Patent Kokai Publication No. JP-A-11-249624

[Patent Document 2] Japanese Patent Kokai Publication No. JP-P2005-110065A

[Patent Document 3] Japanese Patent Kokai Publication No. JP-P2001-292041A

SUMMARY OF THE DISCLOSURE

An increase in number of gray levels (an increase in colors) is accelerating in recent liquid crystal display devices in pursuit of better display quality. In a case where a 6-bit digital video signal is handled, a 64 gray-level (260,000-color) display is possible. A 256 gray-level (16,800,000-color) display is possible in the case of eight bits, and a 1024 gray-level (1,070,000,000-color) display is possible in the case of ten bits.

In order to implement such an increase in number of gray levels with the configuration of the data driver illustrated in FIG. 1, it is required that the number of grayscale voltage lines conform to the number of gray levels. Further, the number of transistors for selecting grayscale voltages also increases, and so does the decoder area. This leads to an increase in die cost, which constitutes a first problem of the conventional art. Further, as the number of gray levels increases, the voltage between adjacent gray levels decreases and outputs of higher precision are required. This is a second problem of the conventional art. In particular, in the case of a circuit formed by TFTs (thin-film transistors), a decline in output precision ascribable to variations in fabrication is more conspicuous in comparison with a circuit constituted by transistors formed on mono-crystalline silicon.

With respect to the demand for a high-precision output, the method of time-averaging offset over a plurality of frames described in Patent Document 1 is such that in the case of the above-mentioned TFT circuit configuration, for example, the absolute value of the offset per se is large and, hence, there is a limitation upon the offset suppressing effect. By contrast, the methods described in Patent Documents 2 and 3 correct the absolute value of offset using capacitance and therefore exhibit a satisfactory offset suppressing effect even in instances where there is a large variation in offset value, as in the case of the TFT circuit.

However, none of the inventions of Patent Documents 1, 2 and 3 solve the first problem of the conventional art, namely the increase in die cost resulting from the greater number of gray levels. In order to solve the first problem, a multi-level-output amplifier that is capable of outputting a large number of voltage levels with a small number of levels is required.

Accordingly, the present invention provides a multi-level-output differential amplifier, digital-to-analog converter and display device that make possible a reduction in decoder area and that are capable of supporting a high-precision output.

The present invention disclosed herein has the configuration set forth below as means for solving the aforementioned problem. In the implementation set forth below, the alphanumerics within the parentheses indicate the reference numerals and characters of the corresponding elements in the examples and are for the sole purpose of clarifying the corresponding relationship; they do not limit the present invention.

(A1) A differential amplifier according to a first aspect of the present invention comprises:

first to mth (where m is an integer equal to or greater than 2) input terminals (e.g., VIN1, VIN2, VIN3 in a case where m is 3);

an output terminal (VOUT);

first to mth differential pairs (Ma1, Mb1), (Ma2, Mb2), (Ma3, Mb3);

a current source circuit (I1, I2, I3) for supplying currents to the respective first to mth differential pairs (Ma1, Mb1), (Ma2, Mb2), (Ma3, Mb3);

first outputs of each of output pairs of the first to mth differential pairs being connected by a first node and second outputs of each of output pairs of the first to mth differential pairs being connected by a second node;

a load circuit (M11, M12) connected to the first and second nodes;

an amplifier stage (703) receiving a signal from at least one node of the first and second nodes as an input and having its output connected to the output terminal; and a capacitance element (C1).

A data output period includes first and second periods (T01, T02).

In the present invention, in the first period (T01), responsive to a control signal, one input (a first input) of each input pair of the first to mth differential pairs (Ma1, Mb1), (Ma2, Mb2), (Ma3, Mb3) is made a non-inverting input and the other input (a second input) of each of the input pairs of the first to mth differential pairs is made an inverting input, one end of the capacitance element (C1) is connected to all of the second inputs of the m input pairs, the first to mth input terminals are connected so as to be in one-to-one correspondence with the first inputs of the input pairs of the first to mth differential pairs, the output terminal is connected in common with all of the second inputs of each of the input pairs of the first to mth differential pairs, and the output voltage of the amplifier stage (the output terminal voltage) is stored at the one end of the capacitance element (C1).

In the present invention, in the second period (T02), responsive to the control signal, the first input of each input pair of the first to mth differential pairs is made an inverting input and the second input of each of the input pairs of the first to mth differential pairs is made a non-inverting input, voltage held at the one end of the capacitance element (C1) is connected in common with all of the second inputs of the input stages of the first to mth differential pairs, and the output terminal is connected in common with all of the second inputs of the input pairs of the first to mth differential pairs.

(A2) In the differential amplifier according to the present invention, in the first period, responsive to the control signal, m input voltages Vin1, Vin2, . . . , Vinm are applied so as to be in one-to-one correspondence with respective first inputs of the input pairs of the m differential pairs, and a voltage value that is the result of adding a voltage obtained by weighting and averaging the m input voltages at prescribed ratios and an offset voltage ascribable to the m differential pairs is stored at the one end of the capacitance element (C1), as expressed by the following equation:

$$Vout = \frac{a1 \cdot Vin1 + a2 \cdot Vin2 + \ldots + am \cdot Vinm}{a1 + a2 + \ldots + am} + Vof,$$

where Vin1, Vin2, . . . , Vinm are input voltages, a1, a2, . . . , am are weightings of the respective input voltages, and Vof is the offset voltage.

In the second period, changeover control is exercised in such a manner that the voltage that has been stored in the capacitance element is applied to all of the second inputs of the input pairs of the m differential pairs, the offset voltage is corrected, and a voltage is output that is equal to the voltage obtained by weighting and averaging the m input voltages at the prescribed ratio, as expressed as follows:

$$Vout = \frac{a1 \cdot Vin1 + a2 \cdot Vin2 + \ldots + am \cdot Vinm}{a1 + a2 + \ldots + am}$$

(A3) Further, in the present invention, the current source circuit comprises current sources (I1, I2, I3) for supplying currents individually to respective first to mth differential pairs.

(A4) In the present invention, a ratio of channel widths W1, W2, . . . Wm of transistors constructing the first to mth differential pairs is made $a1^2:a2^2: \ldots :am^2$, and a ratio of current quantities I1, I2, . . . , Im of the m current sources is made 1:1: . . . 1.

(A5) In the present invention, the current source circuit comprises a single current source for supplying current to all of the m differential pairs.

(A6) The differential amplifier according to the present invention includes:

first to mth input switches (Sa1, Sa2, Sa3) for performing on-and-off control of connections between the first inputs of the input pairs of the first to mth differential pairs and the first to mth input terminals, respectively;

first to mth negative-feedback connection switches (Sb1, Sb2, Sb3) for performing on-and-off control of connections between the respective first inputs of the input pairs of the first to mth differential pairs and the output terminal, respectively; and a first switch (Sc1) for performing on-and-off control of a connection between the one end of the capacitance element (C1) and the output terminal (VOUT).

In the first period (T01), responsive to the control signal, the first to mth input switches (Sa1, Sa2, Sa3) are set in an ON state, the first to mth negative-feedback connection switches (Sb1, Sb2, Sb3) are set in an OFF state, the first switch (Sc1) is set in an ON state, the output terminal is connected to the one end of the capacitance element via the first switch (Sc1), and the output voltage of the amplifier stage is applied to the one end of the capacitance element.

In the second period (T02), the first to mth input switches (Sa1, Sa2, Sa3) are set in an OFF state, the first to mth negative-feedback connection switches (Sb1, Sb2, Sb3) are set in an ON state, the first switch (Sc1) is set in an OFF state, voltage held at the one end of the capacitance element (C1) is connected in common with all of the second inputs of the input pairs of the first to mth differential pairs, the output terminal is connected for negative feedback to the first inputs of the input pairs of the first to mth differential pairs via the first to mth negative-feedback connection switches (Sb1, Sb2, Sb3), and amplification and output are performed.

(A7) In a differential amplifier according to the present invention, m is made 2 and the differential amplifier comprises:

first and second input terminals (VIN1, VIN2);

an output terminal (VOUT);

first and second differential pairs (Ma1, Mb1), (Ma2, Mb2);

a current source circuit (I1, I2) for supplying currents to the respective first and second differential pairs;

first outputs of each of output pairs of the first and second differential pairs being connected by a first node and second outputs of each of output pairs of the first and second differential pairs being connected by a second node;

a load circuit (M11, M12) connected to the first and second nodes;

an amplifier stage (703) receiving a signal from at least one node of the first and second nodes as an input and having its output connected to the output terminal; and a capacitance element (C1).

In the present invention, a data output period includes first and second periods (T01, T02).

In the first period (T01), responsive to a control signal, a first input of each input pair of the first and second differential pairs is made a non-inverting input and a second input of each of the input pairs of the first and second differential pairs is made an inverting input, the one end of the capacitance element (C1) is connected to all of the second inputs of the first and second input pairs, the first input terminal is connected to the first input of the input pair of the first differential pair, the second input terminal is connected to the first input of the input pair of the second differential pair, and the output terminal is connected to all of the second inputs of the input pairs of the first and second differential pairs.

In the second period (T02), responsive to a control signal, the first input of the input pairs of the first and second differential pairs is made an inverting input and the second input of the input pairs of the first and second differential pairs is made a non-inverting input, voltage held at the one end of the capacitance element (C1) is connected in common with all of the second inputs of the input stages of the first to mth differential pairs, the output terminal is connected in common with all of the first inputs of the input pairs of the first and second differential pairs, and the one end of the capacitance element (C1) is connected in common with all of the second inputs of the input pairs of the first and second differential pairs.

In the differential amplifier according to the present invention, in the first period (T01), two input voltages (Vin1, Vin2) are applied to respective first inputs of the input pairs of the first and second differential pairs, and a voltage value that is the result of adding a voltage obtained by internally dividing the two input voltages at a ratio of a2:a1 and an offset voltage ascribable to the first and second differential pairs is stored at the one end of the capacitance element (C1), as expressed by the following equation:

$$Vout = \frac{a1 \cdot Vin1 + a2 \cdot Vin2}{a1 + a2} + Vof,$$

where Vin1 and Vin2 are input voltages, a1 and a2 are interpolation ratios, and Vof is the offset voltage.

In the second period (T02), the voltage that has been stored in the capacitance element is input in common to all of the second inputs of the input pairs of the first and second differential pairs, the offset voltage is corrected, and a voltage is output that is equal to the voltage obtained by internally dividing the two input voltages at a ratio of a2:a1, as expressed by the following equation:

$$Vout = \frac{a1 \cdot Vin1 + a2 \cdot Vin2}{a1 + a2}$$

(A8) The differential amplifier according to the present invention includes:

a first input switch (Sa1) arranged between the first input of the first differential pair and the first input terminal;

a second input switch (Sa2) provided between the first input of the second differential pair and the second input terminal;

a first negative-feedback connection switch (Sb1) provided between the first input of the first differential pair and the output terminal;

a second negative-feedback connection switch (Sb2) provided between the first input of the second differential pair and the output terminal; and a first switch (Sc1) provided between the one end of the capacitance element (C1) and the output terminal.

In the first period (T01), responsive to the control signal, the first and second input switches are set in an ON state, the first and second negative-feedback connection switches are set in an OFF state, the first switch is set in an ON state, the output terminal is connected for negative feedback via the first switch, and the amplified output voltage is held at the one end of the capacitance element.

In the second period (T02), the first and second input switches are set in an OFF state, the first and second negative-feedback connection switches are set in an ON state, the first switch is set in an OFF state, voltage held at the one end of the capacitance element is connected in common with all of the second inputs of the first and second input pairs, the output terminal is connected for negative feedback via the first and second negative-feedback connection switches, and amplification and output are performed.

(A9) Further, in the present invention, the current source circuit comprises:

a first current source (I1) for supplying current to the first differential pair, and a second current source (I2) for supplying current to the second differential pair.

in the present invention, a ratio of channel widths W1 and W2 of transistors constituting the first and second differential pairs is made $a1^2:a2^2$, and a ratio of current quantities I1 and I2 of the two current sources is made 1:1.

(A10) The differential amplifier of the present invention includes:

a fourth switch (Sc4) between the first node and the input end of the amplifier stage, and a fifth switch (Sc5) between the second node and the input end of the amplifier stage.

In the first period (T01), the fifth switch is turned off by the control signal and the first node is connected to the input end of the amplifier stage via the fourth switch, which is in an ON state.

In the second period (T02), the fourth switch is turned off by the control signal and the second node is connected to the input end of the amplifier stage via the fifth switch, which is in an ON state.

(A11) In the present invention, the amplifier stage comprises:

a differential amplifier stage (705);

a sixth switch (Sc6) for performing on-and-off control of a connection between the first node and the first input of the input pair of the differential amplifier stage;

a seventh switch (Sc7) for performing on-and-off control of a connection between the first node and the second input of the input pair of the differential amplifier stage;

an eighth switch (Sc8) for performing on-and-off control of a connection between the second node and the second input of the input pair of the differential amplifier stage; and a ninth switch (Sc9) for performing on-and-off control of a connection between the second node and the first input of the input pair of the differential amplifier stage.

(A12) Further, in the present invention, the load circuit comprises: a current mirror circuit that includes first and second transistors (M11, M12) having gates coupled together and sources coupled together;

a third switch (Sc3) provided between the gate and drain of the first transistor; and a second switch (Sc2) provided between the gate and drain of the second transistor; the drain of the first transistor being connected to the first node and the drain of the second transistor being connected to the second node.

In the first period, the third switch is turned off and the second switch is turned on by the control signal, whereby the second transistor is diode-connected, the second node is made the input to the current mirror circuit and the first node is made the output of the current mirror circuit.

In the second period, the second switch is turned off and the third switch is turned on by the control signal, whereby the first transistor is diode-connected, the first node is made the input to the current mirror circuit and the second node is made the output of the current mirror circuit.

(A13) Further, in the present invention, it may be so arranged that an output switch (SWout) is provided between the output terminal (VOUT) and an external load, the output switch being turned off by the control signal in the first period.

(A14) Further, in the present invention, the first switch (Sc1) provided between the one end of the capacitance element (C1) and the output terminal (VOUT) is constituted by a third transistor (M31), a fourth transistor (M32) whose drain and source are short-circuited is provided between the drain or source of the third transistor and the one end of the capacitance element, the first control signal is supplied to the gate of the third transistor, the second control signal is supplied to the gate of the fourth transistor, and the second control signal is a signal that is the inverse of the first control signal.

(A15) A digital-to-analog converter according to another aspect of the present invention has a differential amplifier according to the present invention set forth in any one of (A1) to (A14) above and comprises a resistor array having a plurality of registers connected serially between a first potential on a high-potential side and a second potential on a low-potential side; and a selecting circuit which receives potentials from taps of the resistor array and selects input voltages, which are to be supplied to a plurality of input terminals, based upon a selection signal.

(A16) A display device according to a further aspect of the present invention has differential amplifiers according to the present invention set forth in any one of (A1) to (A14) above;

a plurality of data lines include a first data line and a second data line adjacent to the first data line;

a plurality of differential amplifiers include a charging first differential amplifier and a discharging second differential amplifier;

first and second output switches are provided between the first differential amplifier and the first and second data lines;

third and fourth output switches are provided between the second differential amplifier and the first and second data lines;

in a prescribed data output period, the second and third output switches are turned off and the first and fourth output switches turned on and in a data output period that follows the prescribed data output period, the first and fourth output switches are turned off and the second and third output switches turned on.

The meritorious effects of the present invention are summarized as follows.

The present invention provides a differential amplifier in which it is possible to achieve a highly precise output of voltages with low power regardless of a variation in element characteristics due to fabrication, and in which it is possible to increase the number of multi-level-outputs. This makes it possible to reduce the number of grayscale voltages that are applied to decoders and to reduce the area of a digital-to-analog converter.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

Figures 14A, 14B:
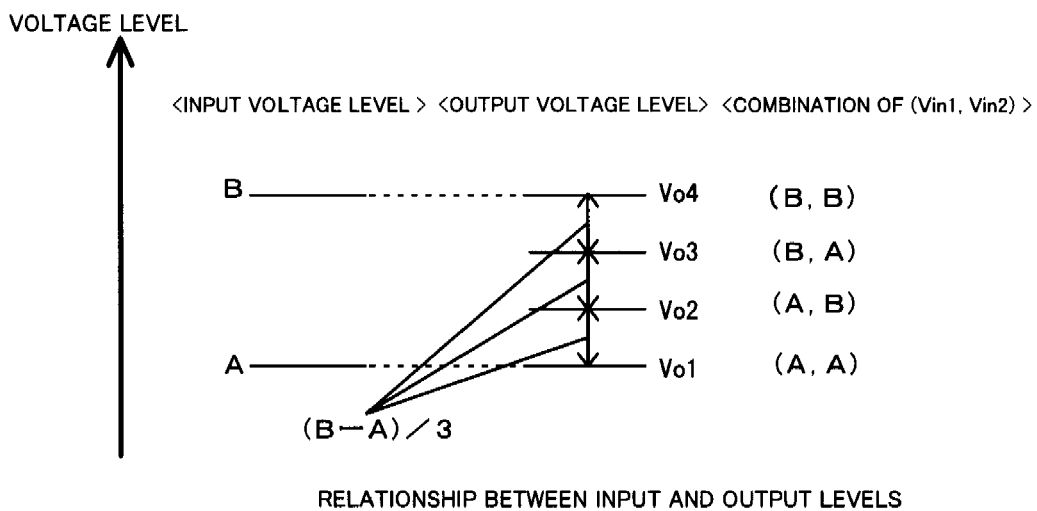
Figure 15:
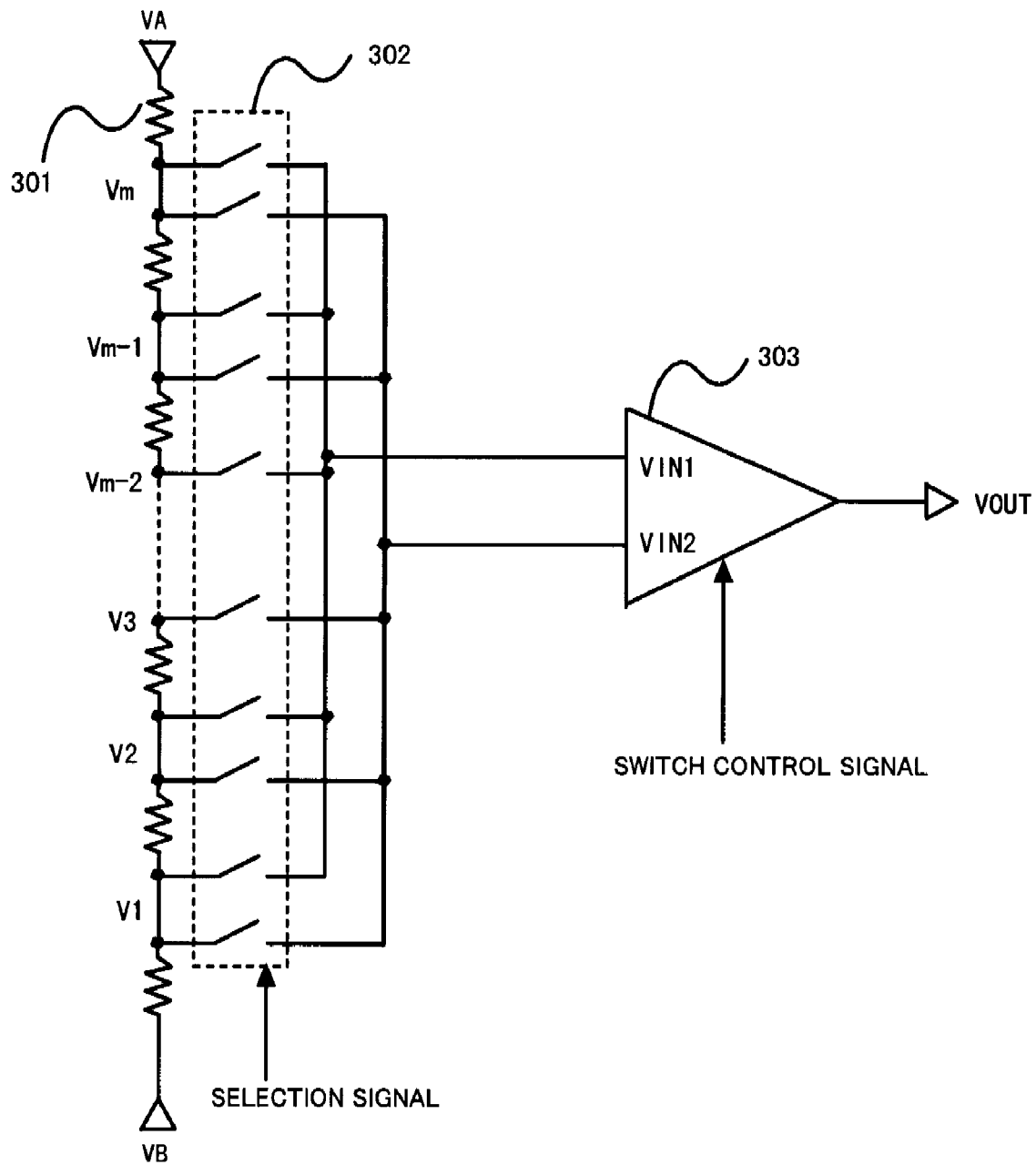
Figure 16:
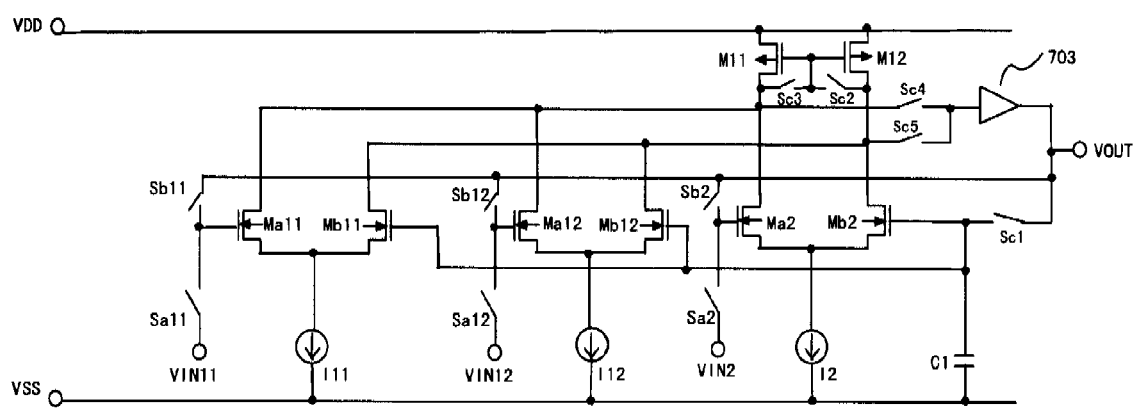
Figure 17:
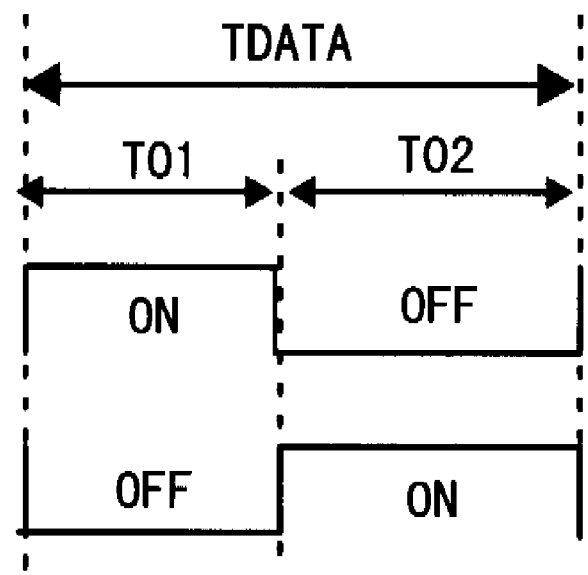
Figure 18A:
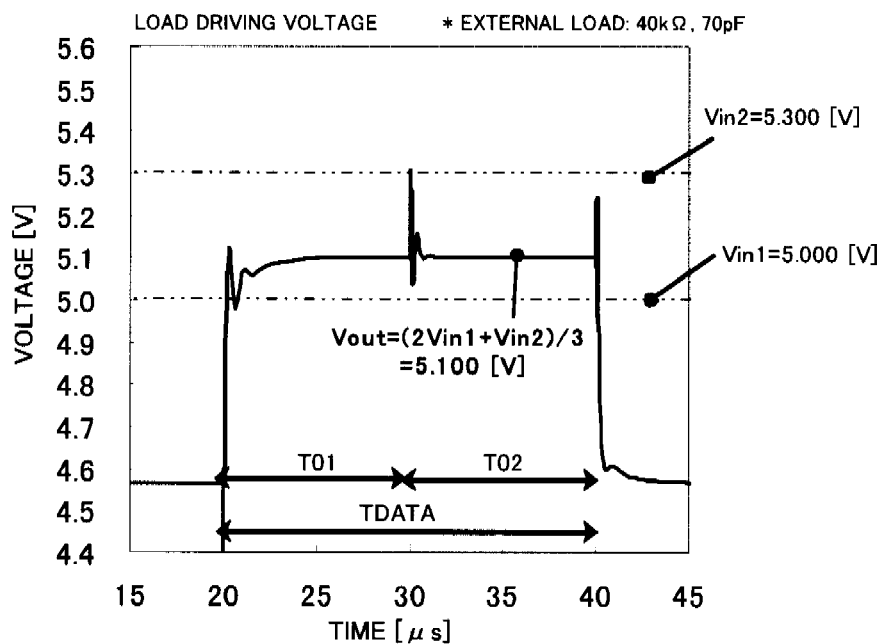
Figure 18B:
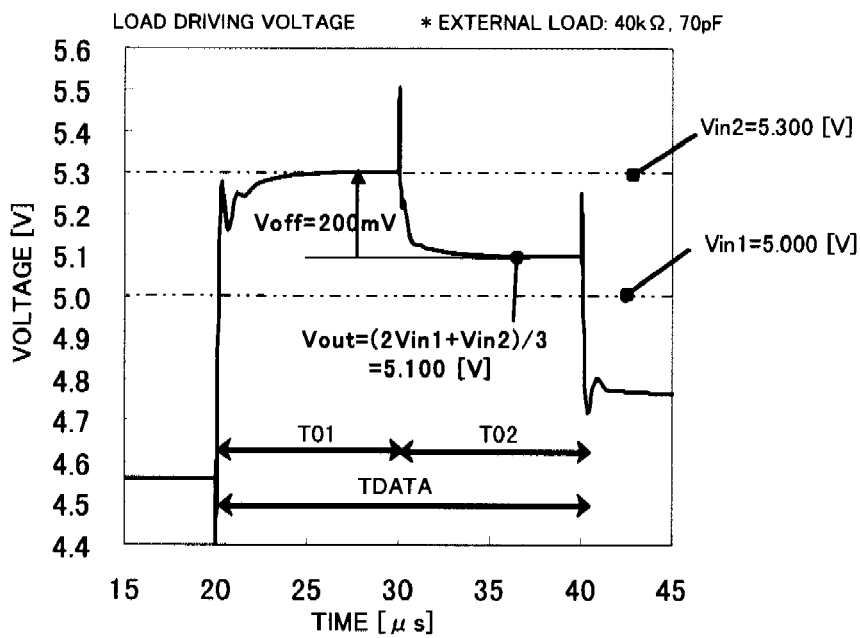
Figure 19A:
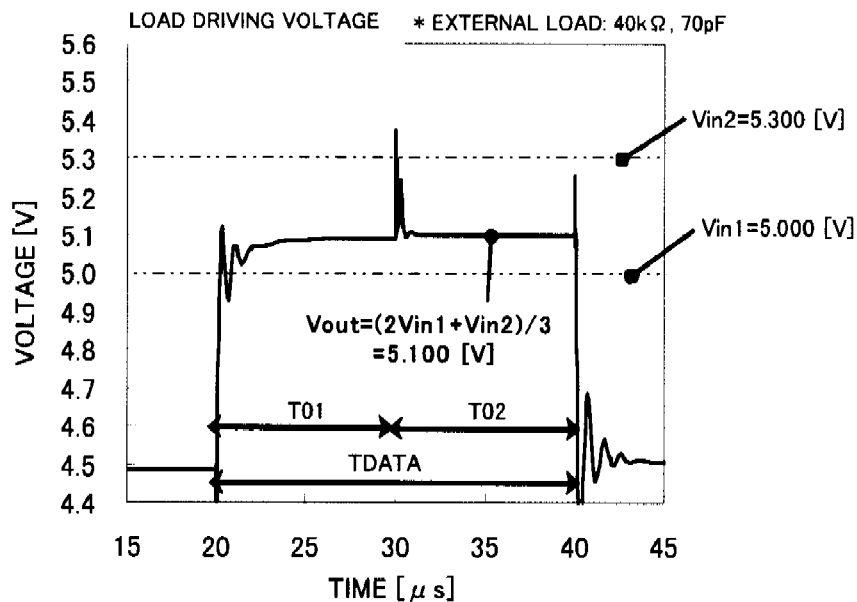
Figure 19B:
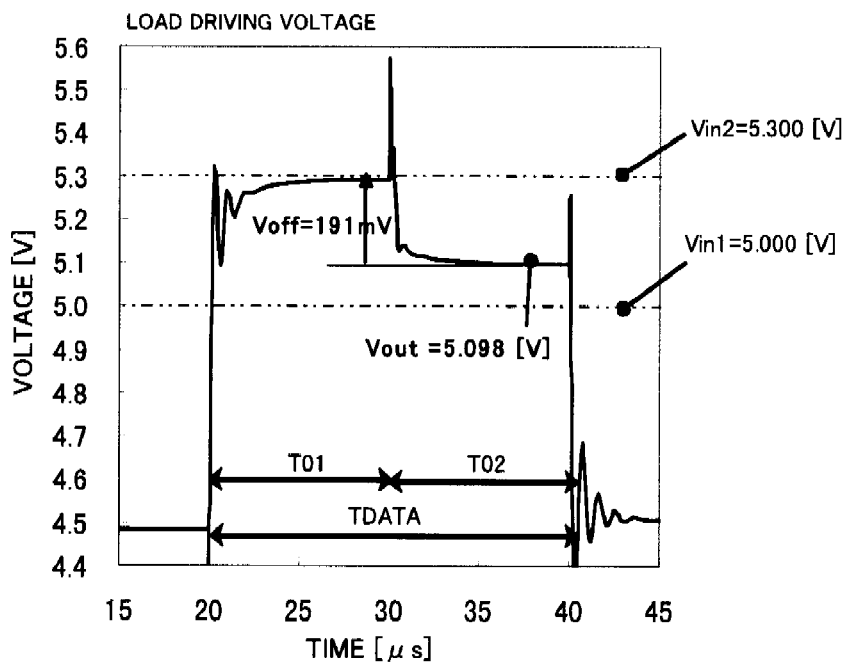
Figure 20:
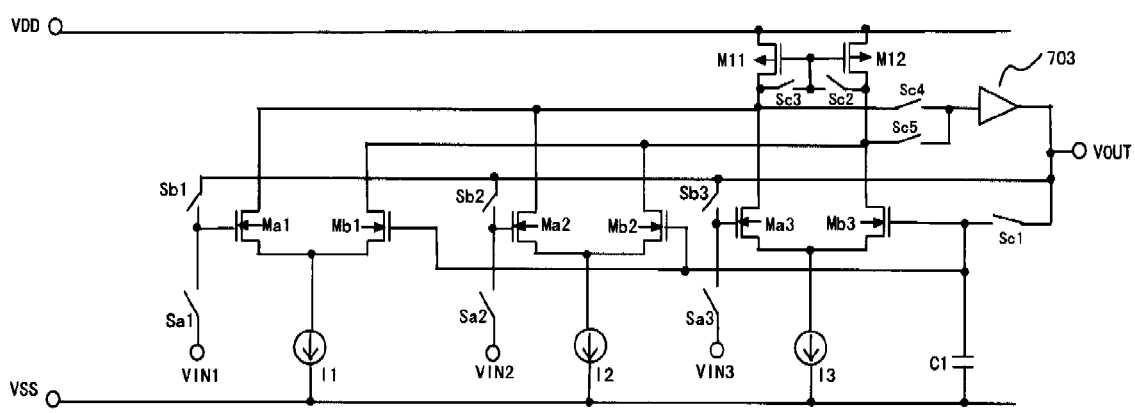
Figure 21:
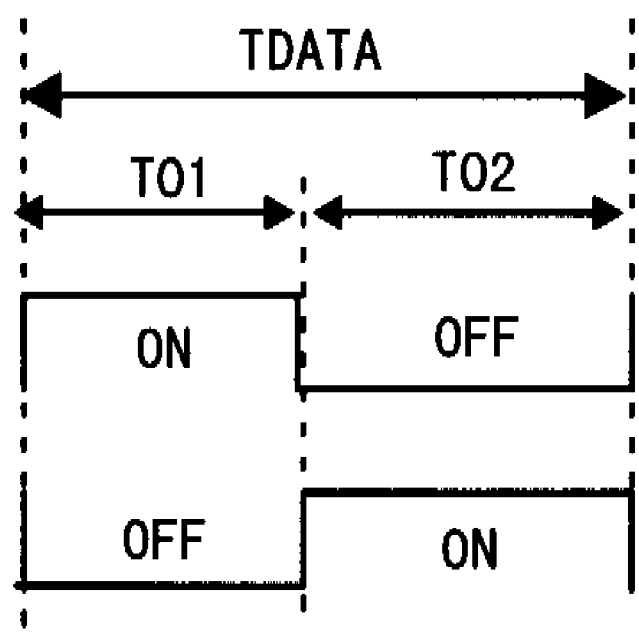
Figure 22A:
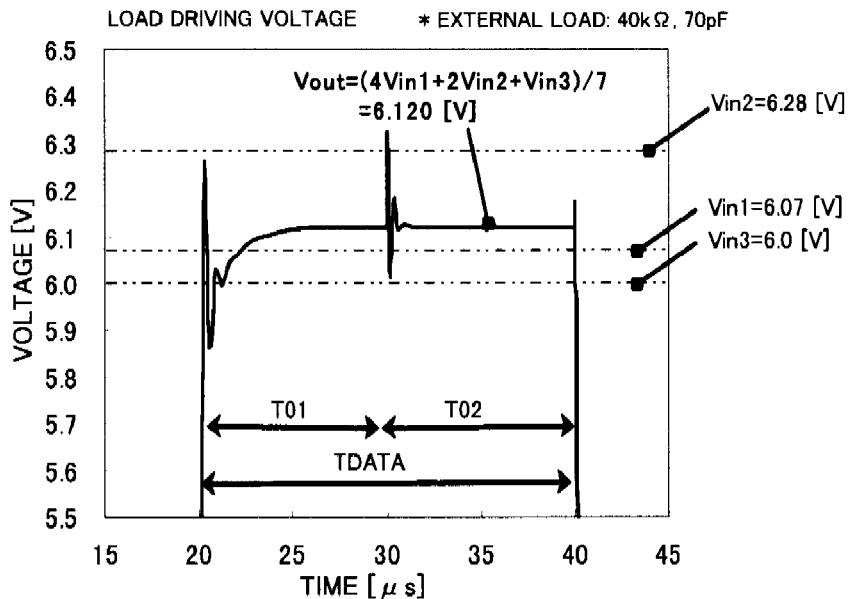
Figure 22B:
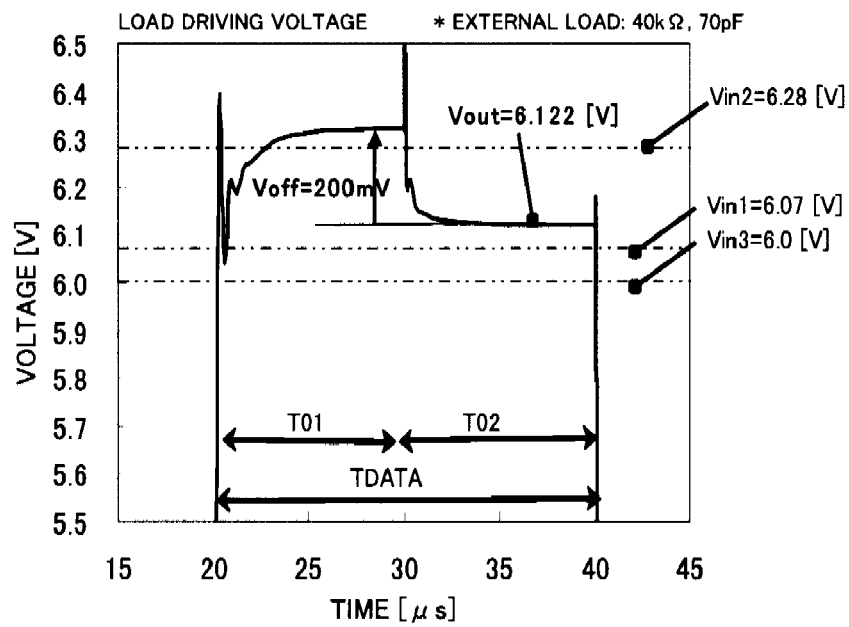
Figure 23:
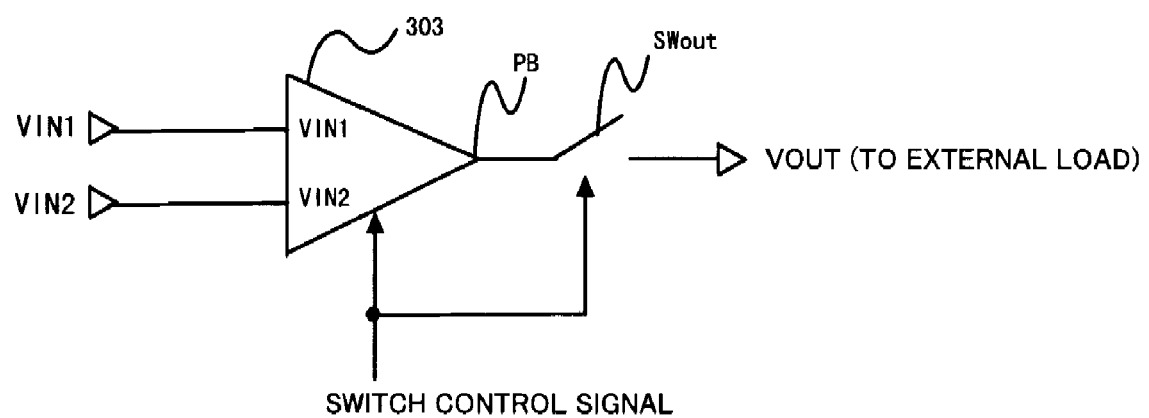
Figure 24:
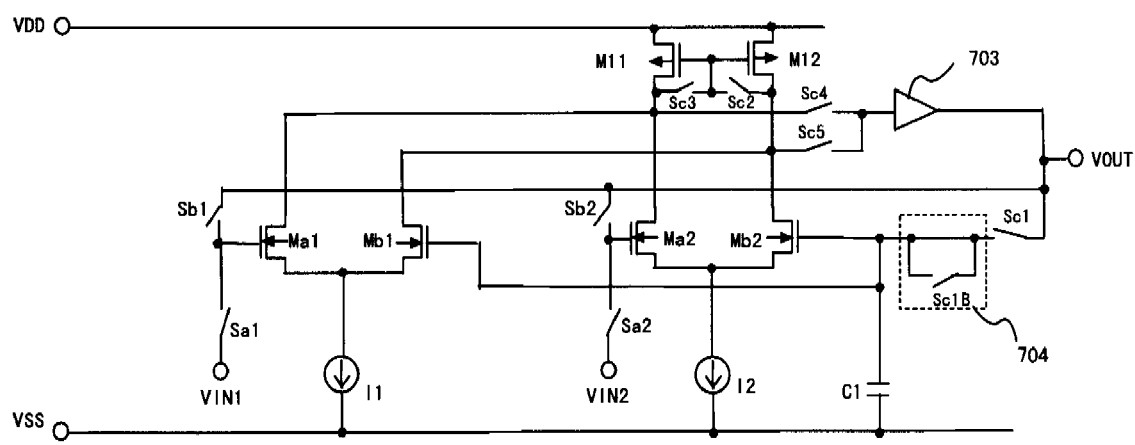
Figure 25:
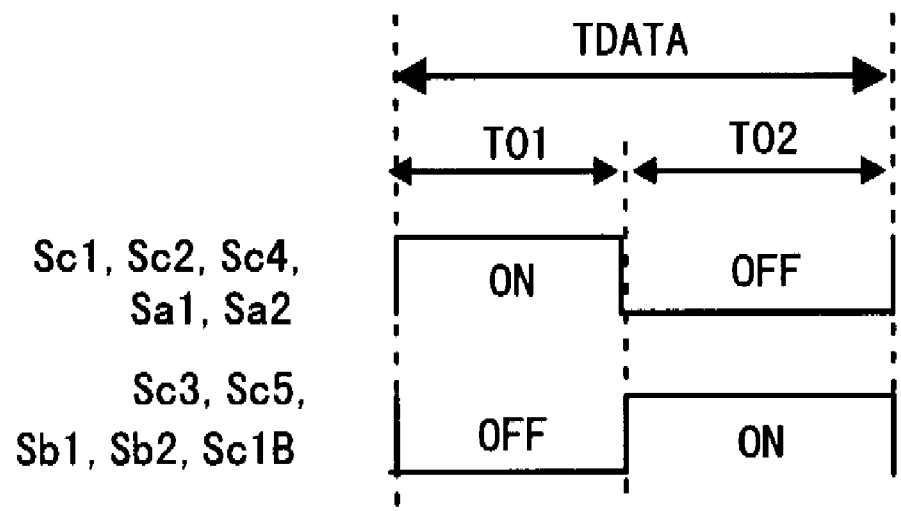
Figure 26A:
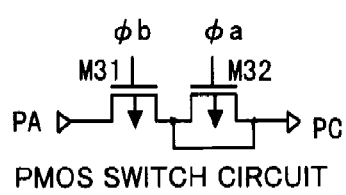
Figure 26B:
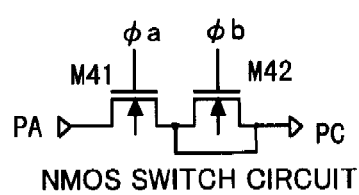
Figure 26C:
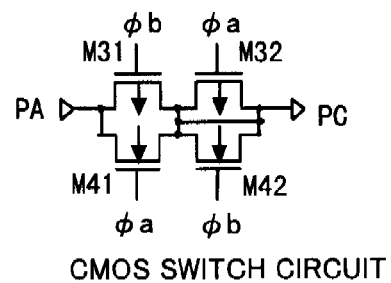
Figure 27:
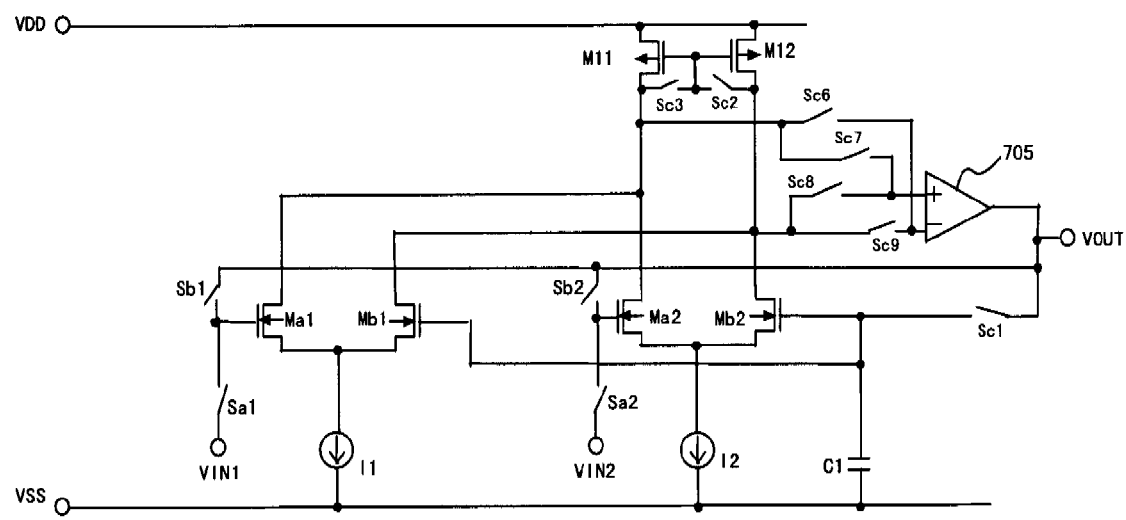
Figure 28:
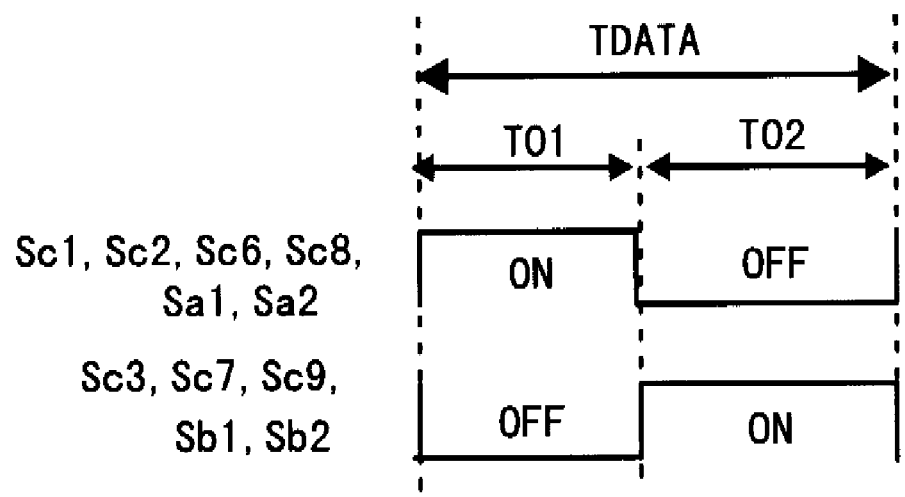
Figure 29:
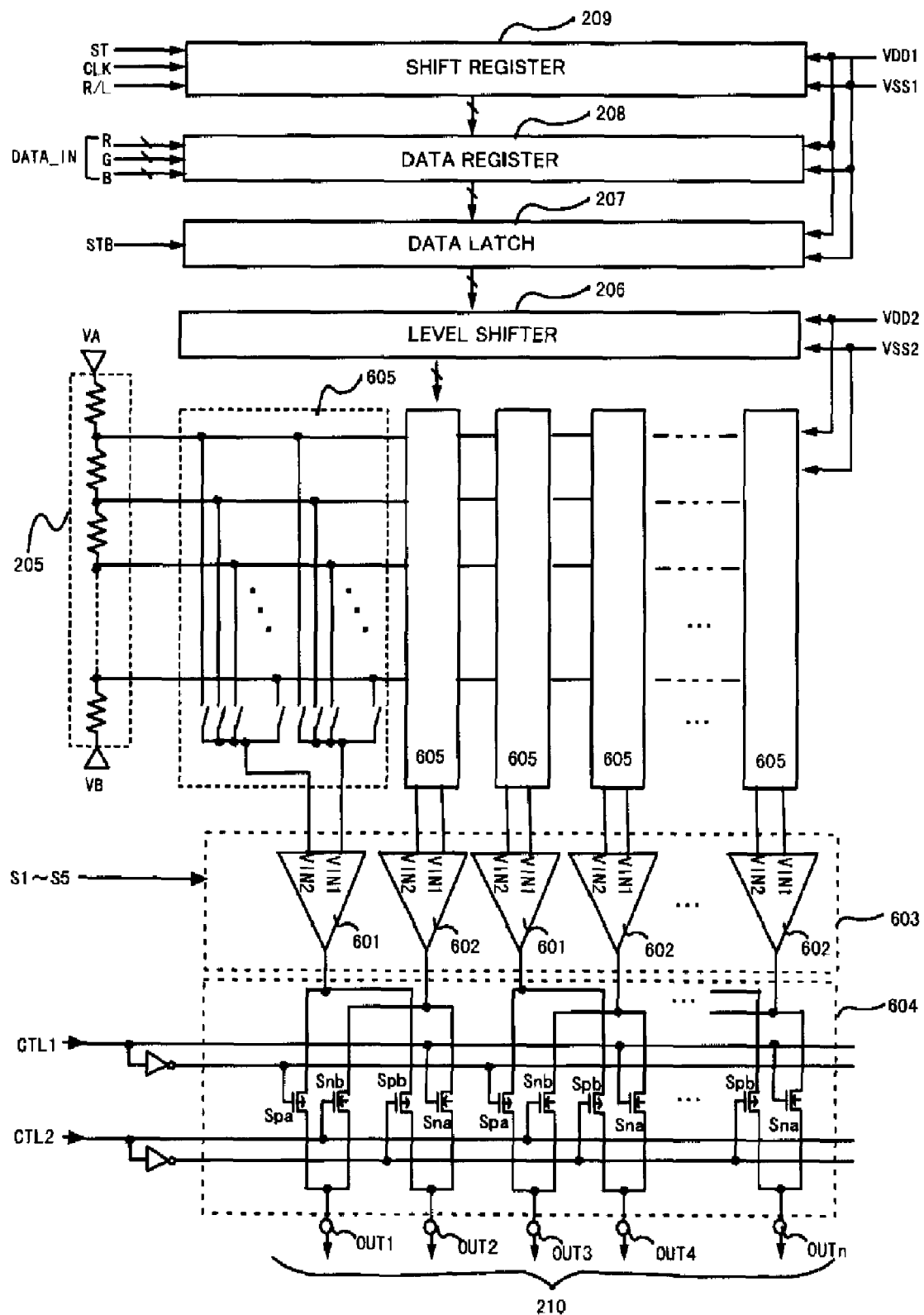
Figure 30:
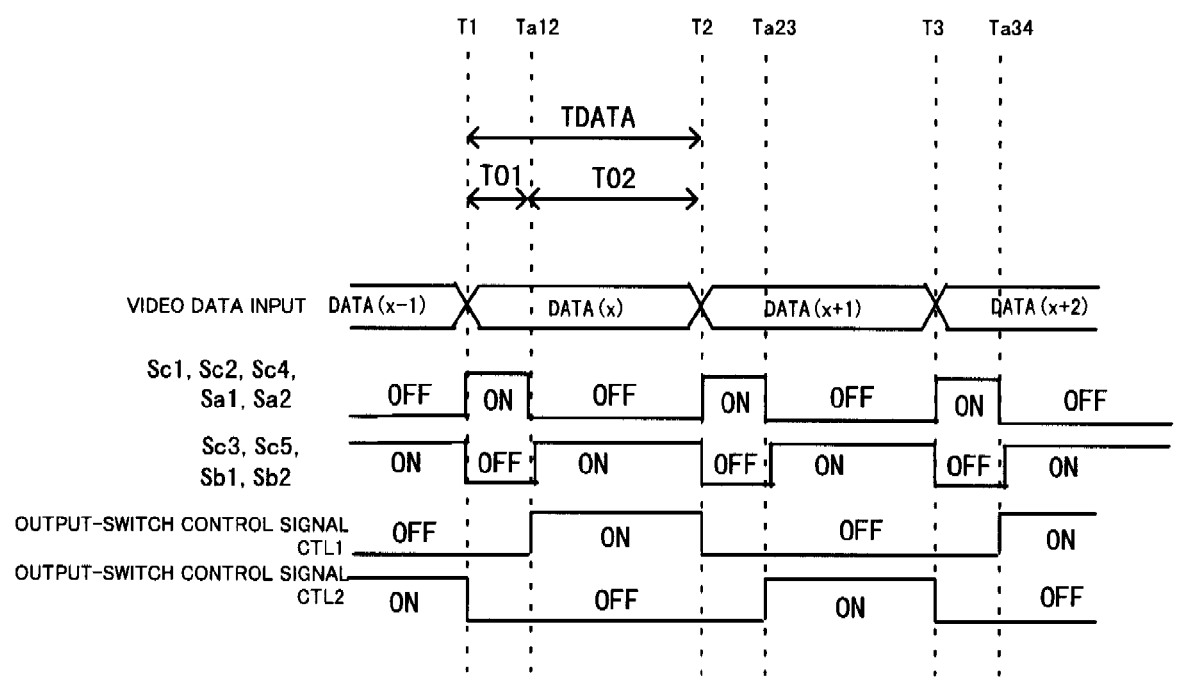

FIGS. 14A and B are a diagram and table useful in describing implementation of a multi-level-output by the differential amplifier according to the first example of the present invention;

FIG. 15 is a diagram illustrating the configuration of a digital-to-analog converter having a differential amplifier according to an example of the present invention;

FIG. 16 is a diagram illustrating a first modification of the differential amplifier according to the first example of the present invention;

FIG. 17 is a time chart illustrating switch control in the differential amplifier of FIG. 16;

FIGS. 18A and 18B are diagrams illustrating examples of output voltage vs. time waveforms obtained by TFT circuit simulation in the first modification of the differential amplifier according to the first example of the present invention;

FIGS. 19A and 19B are diagrams illustrating examples of output voltage vs. time waveforms obtained by TFT circuit simulation in the second modification of the differential amplifier according to the first example of the present invention;

FIG. 20 is a diagram illustrating the circuit configuration of a differential amplifier in a second example of the present invention;

FIG. 21 is a timing chart illustrating switch control in the differential amplifier according to the second example of the present invention;

FIGS. 22A and 22B are diagrams illustrating examples of output voltage vs. time waveforms obtained by TFT circuit simulation in the differential amplifier according to the second example of the present invention;

FIG. 23 is a diagram illustrating the circuit configuration of a differential amplifier in a third example of the present invention;

FIG. 24 is a diagram illustrating the circuit configuration of a differential amplifier in a fourth example of the present invention;

FIG. 25 is a timing chart of switch control in a differential amplifier according to the fourth example of the present invention;

FIGS. 26A, 26B and 26C are diagrams illustrating examples of configurations of switch-noise compensating circuits according to the fourth example of the present invention;

FIG. 27 is a diagram illustrating the circuit configuration of a differential amplifier in a fifth example of the present invention;

FIG. 28 is a timing chart illustrating switch control in the differential amplifier according to the fifth example of the present invention;

FIG. 29 is a diagram illustrating the configuration of a data driver in a display device according to a sixth example of the present invention; and FIG. 30 is a timing chart of control of the data driver in the display device according to the sixth example of the present invention.

PREFERRED MODES OF THE INVENTION

Preferred modes of the present invention will now be described in detail with reference to the accompanying drawings. It should be noted that identical structural elements in the Figures are designated by like reference characters.

FIRST EXAMPLE

Figure 9:
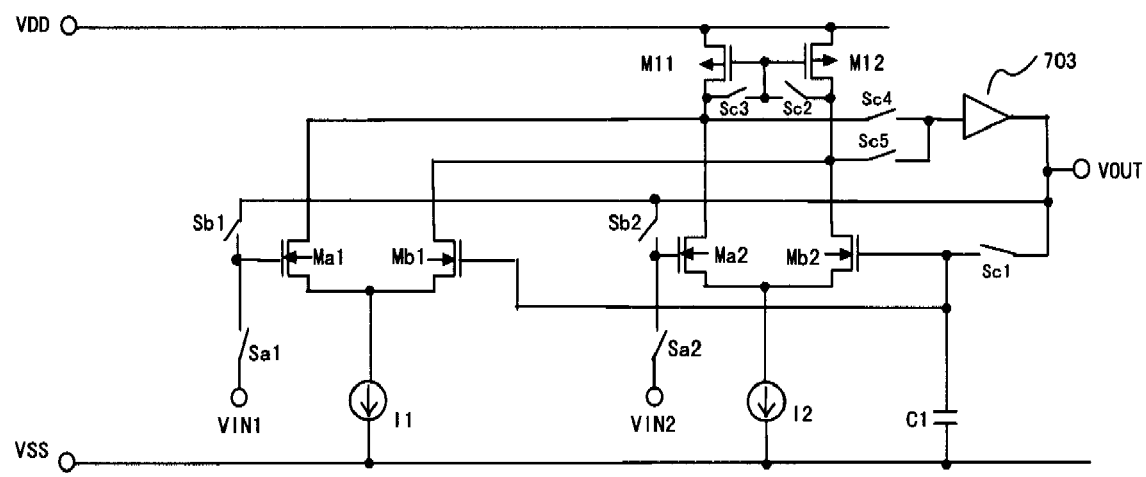
FIG. 9 is a diagram illustrating the circuit configuration of a differential amplifier of a high-voltage amplifier in a first example of the present invention.

In a first example of the present invention, the implementation of a multi-level-output in a case where two input voltages are applied will be described with reference to the drawings. The configuration of a circuit according to the first example of the invention will be described below. FIG. 9 is a diagram illustrating the configuration of a differential amplifier according to the first example. The differential amplifier according to this example comprises: a first differential pair (Ma1, Mb1) driven by a current source I1; a second differential pair (Ma2, Mb2) driven by a current source I2; a current mirror load circuit (M11, M12) to which the output pairs of the differential pairs are connected in common; and an output-stage amplifying circuit 703.

The gate of transistor Ma1 constituting the first differential pair (namely the first input of the input pair of the first differential pair) is connected to an input terminal VIN1 via a switch Sa1 and to an output terminal VOUT via a switch Sb1.

The gate of transistor Ma2 constituting the second differential pair (namely the first input of the input pair of the second differential pair) is connected to an input terminal VIN2 via a switch Sa2 and to the output terminal VOUT via a switch Sb2.

The gate of transistor Mb1 constituting the first differential pair (namely the second input of the input pair of the first differential pair) and the gate of transistor Mb2 constituting the second differential pair (namely the second input of the input pair of the second differential pair) are connected in common with one end of a capacitor C1 and are connected to the output terminal VOUT via a switch Sc1.

Transistors M11 and M12 constituting the load circuit have their sources connected in common with a power source VDD and their gates tied together, a switch Sc3 is provided between the gate and drain of transistor M11, and a switch Sc2 is provided between the gate and drain of transistor M12. Whether or not transistor M11 is diode-connected (i.e., whether or not its drain and gain are short-circuited) is decided by the switching of the switch Sc1. Whether or not transistor M12 is diode-connected is decided by the switching of the switch Sc2.

Further, the drain of transistor M11 constituting the load circuit is connected to the input end of the amplifier stage 703 via a switch Sc4, and the drain of transistor M12 constituting the load circuit is connected to the input end of the amplifier stage 703 via a switch Sc5.

In the first example of the present invention, the element size of each transistor and the amounts of current of the current sources are decided as set forth below. If we let Wa1 and Wb1 represent the gate widths of the transistors (Ma1, Mb1) of the first differential pair, let Wa2 and Wb2 represent the gate widths of the transistors (Ma2, Mb2) of the second differential pair and let the current quantities (current values) of the current sources I1 and I2 be represented by the same symbols I1 and I2, then the ratio among these quantities is defined by the relations indicated by the following equations:

$$Wa1:Wb1:Wa2:Wb2 = 4:4:1:1 \quad (1)$$

$$I1:I2 = 1:1 \quad (2)$$

Next, the operation of the differential amplifier according to the example shown in FIG. 9 will be described with reference to the switch-control timing chart of FIG. 10. In offset detection period T01, the switches Sc1, Sc2, Sc4, Sa1 and Sa2 are set in an ON state and the switches Sc3, Sc5, Sb1 and Sb2 are set in an OFF state.

Figure 11:
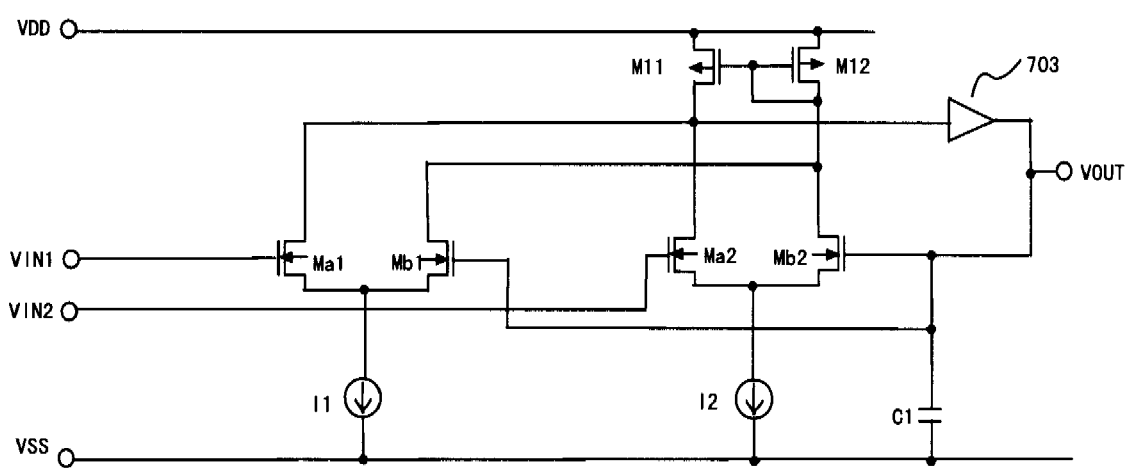
FIG. 11 is a diagram illustrating the state of circuit connections in FIG. 9 in an offset detection period T01.

The circuit connections in period T01 are illustrated in FIG. 11. The gates of transistors Ma1 and Ma2 are made non-inverting inputs, and the gates of transistors Mb1 and Mb2 are made inverting inputs. The input terminal VIN1 is connected to the gate of transistor Ma1, the input terminal VIN2 is connected to the gate of transistor Ma2, the gates of transistors Mb1 and Mb2 are connected in common with capacitor C1 and are negative-feedback-connected to the output terminal VOUT.

If we let Vin1 and Vin2 represent the voltages that are applied to the input terminals VIN1 and VIN2, respectively, and assume that Vin1 and Vin2 are voltage values that differ from each other, then output voltage Vout in period T01 is given by Equation (3) below.

$$Vout = \frac{2V_{in1} + V_{in2}}{3} + Vof1 = V_{C1} \quad (3)$$

Here Vof1 is an offset voltage. This is a voltage produced by an imbalance in the characteristics of the two differential pairs (Ma1, Mb1) and (Ma2, Mb2). Further, $V_{C1}$ represents the potential at one end of capacitor C1. The output voltage Vout of Equation (3) is held at the one end of capacitor C1.

The amplified output voltage is a voltage that is the result of internally dividing the voltages of the input voltages Vin1 and Vin2 at (1:2). The offset voltage Vof1 is superimposed thereon.

Since the voltage (Vin1+Vin2)/3 obtained by internally dividing the input voltages Vin1 and Vin2 at (1:2) is a voltage value that differs from the externally supplied input voltages Vin1, Vin2, it is possible to obtain four output levels using two input levels.

However, in a case where the differential amplifier according to this example is used as a high-precision amplifier of a display device, it is desirable for the offset voltage Vof1 to be made zero. In actuality, however, the offset voltage Vof1 cannot be eliminated owing to variations in fabrication.

Figure 12:
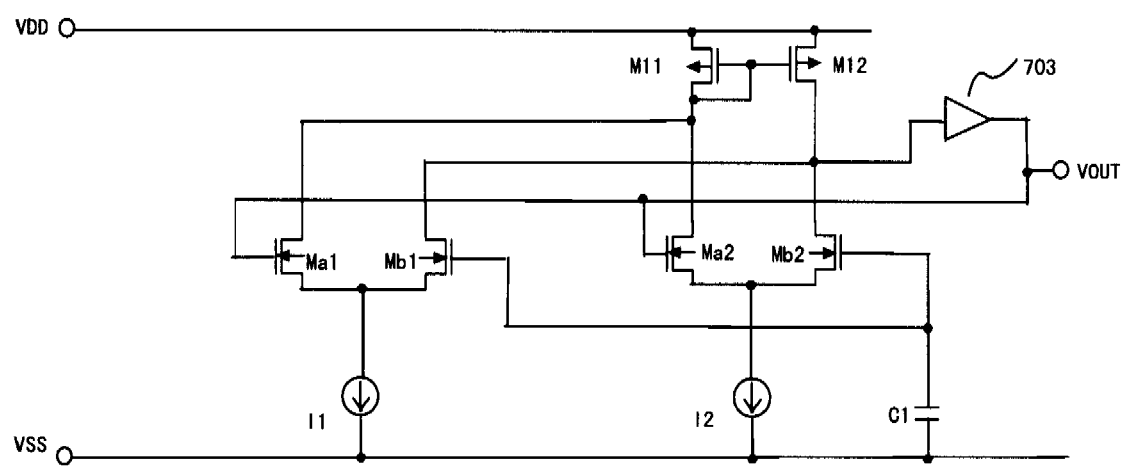
FIG. 12 is a diagram illustrating the state of circuit connections in FIG. 9 in an offset detection period T02.

Next, in period T02, the switches Sc3, Sc5, Sb1 and Sb2 are set in an ON state and the switches Sc1, Sc2, Sc4, Sa1 and Sa2 are set in an OFF state. The circuit connections in period T02 are illustrated in FIG. 12. In FIG. 12, the gates of transistors Mb1 and Mb2 are made non-inverting inputs, and the gates of transistors Ma1 and Ma2 are made inverting inputs. Here the voltage [the output voltage of Equation (3)] held at the one end of capacitor C1 is input commonly to the gates of both transistors Mb1 and Mb2. On the other hand, transistors Ma1 and Ma2 are connected in common with the output terminal VOUT and a negative feedback connection is obtained.

Accordingly, the output voltage Vout in period T02 is as indicated by Equation (4) below.

$$Vout = \frac{2V_{in1} + V_{in2}}{3} + Vof1 - Vof2 \quad (4)$$

Here Vof2 is the offset voltage in period T02. The reason why the negative sign is appended to −V0f2 is because the input polarities of the differential pairs are interchanged between periods T01 and T02.

Further, the reason why the different symbols V0f1 and V0f2 are used is that the input voltage states of the differential inputs are different.

More specifically, in period T01, the two different voltages of input voltages Vin1 and Vin2 are applied to respective ones of the non-inverting inputs of the two differential pairs and the internally divided voltage is generated, amplified and output by operation internally of the differential amplifier. In period T02, however, the voltage of $V_{C1}$ of Equation (3) is input in common to the non-inverting inputs of the two differential pairs and amplification and output are performed.

That is, in period T01, a multi-level-output operation (an operation for generating and outputting a voltage that differs from the externally applied input) is performed within the differential amplifier. In period T02, however, a single-value output operation (an operation for outputting a voltage value identical with that of the input value) is performed in a manner similar to that of an ordinary unity-gain buffer. Thus, the operating mode in period T01 differs from that in period T02 because the voltage values at the nodes in the differential amplifier differ.

However, since the absolute values of the offset voltages Vof1 and Vof2 are the same value owing to operation described below, the output voltage value Vout in period T02 is as indicated by Equation (5) below.

$$Vout = \frac{2V_{in1} + V_{in2}}{3} \quad (5)$$

Accordingly, the offset is corrected and a (1:2) internally divided voltage that is desired can be output with high precision.

The offset correcting operation of the differential amplifier according to this example will now be described.

First, the effects of this operation will be described quantitatively using numerical expressions. In period T01, let $I_{a1}$ and $I_{b1}$, and $I_{a1}$ and $I_{b2}$ represent the currents that flow into transistors Ma1 and Mb1 of the first transistor pair and into the transistors Ma2 and Mb2 of the second differential pair, respectively. Further, let $V_{S1}$ and $V_{S2}$ represent the source potentials connected in common with the two transistors of the first differential pair (Ma1, Mb1) and with the two transistors of the second differential pair (Ma2, Mb2).

In period T01, the load circuit (M11, M12) is such that the gates and sources thereof are commonly connected so that the circuit forms a current mirror, as illustrated in FIG. 11. As a result, the following equation representing the relationship of the currents holds:

$$I_{a1}+I_{a2}=I_{b1}+I_{b2} \quad (6)$$

Furthermore, in this example, the current sources I1 and I2 that drive the two differential pairs are equal, as mentioned above. These current sources cause the currents that flow into the differential pairs to be fixed values and therefore the following current relation hold:

$$I_{a1}+I_{b1}=I_{a2}+I_{b2} \quad (7)$$

The following current relations are derived from Equations (6) and (7):

$$I_{a1}=I_{b2} \quad (8)$$

$$I_{b1}=I_{a2} \quad (9)$$

Further, on the assumption that all transistors operate in a saturated region, the currents are defined by the respective equations (10) to (13) below.

$$I_{a1} = \frac{1}{2} \times 4\beta_n\{(V_{in1} - V_{S1}) - V_{thna1}\}^2 \quad (10)$$

$$I_{b1} = \frac{1}{2} \times 4\beta_n\{(V_{out} - V_{S1}) - V_{thnb1}\}^2 \quad (11)$$

$$I_{a2} = \frac{1}{2}\beta_n\{(V_{in2} - V_{S2}) - V_{thna2}\}^2 \quad (12)$$

$$I_{b2} = \frac{1}{2}\beta_n\{(V_{out} - V_{S2}) - V_{thnb2}\}^2 \quad (13)$$

where the following holds:

$$\beta_n \equiv \mu C_{OX} \frac{W}{L} \quad (14)$$

In the above Equations, $V_{S1}$ and $V_{S2}$ are the common-source potentials of the first and second differential pairs in period T01. β n is a transconductance which is defined as follows:

β n=μ·Cox·W/L where μ is the carrier mobility, Cox is the oxide-film capacitance, W is the gate width and L is the gate length.

The reason for appending "4" to the coefficients of Ia1 and Ib1 is to set the channel width Wa1 (Wb1) of the first differential pair to be four times the channel width Wa2 (Wb2) of the second differential pair. Further, $V_{thna1}$ $V_{thnb1}$, $V_{thna2}$, and $V_{thnb2}$ represent the threshold-value voltage of the transistors Ma1, Mb1, Ma2, and Mb2, respectively.

The common-source potential $V_{S1}$ and common-source potential $V_{S2}$ of the first differential pair vary in dependence upon the currents I1 and I2 that govern the differential pair, the input voltages Vin1 and Vin2 and threshold-value voltages $V_{thna1}$, $V_{thnb1}$, $V_{thna2}$ and $V_{thnb2}$ of the transistors, and these stabilize at different potentials because Vin1 and Vin2 are voltages that differ from each other. The potentials $V_{S1}$ and $V_{S2}$ can be cancelled as set forth below using Equations (8) to (13).

If Equations (10) and (13) are substituted into the relation of Equation (8), then Equation (15) below is obtained.

$$(2V_{in1}-2V_{S1})-2V_{thna1}=(V_{out}-V_{S2})-V_{thnb2} \quad (15)$$

If Equations (11) and (12) are substituted into the relation of Equation (9), then Equation (16) below is obtained.

$$(2V_{out}-2V_{S1})-2V_{thnb1}=(V_{in2}-V_{S2})-V_{thna2} \quad (16)$$

Solving Equation (15) with regard to $V_{S2}$ gives us the following:

$$V_{S2}=V_{out}-2V_{in1}+2V_{S1}+2V_{thna1}-V_{thnb2} \quad (17)$$

Substituting Equation (17) into Equation (16), gives us the following:

$$2V_{out} - 2V_{S1} - 2V_{thnb1} = \quad (18)$$
$$V_{in2} - (V_{out} - 2V_{in1} + 2V_{S1} + 2V_{thna1} - V_{thnb2}) - V_{thna2}$$
$$\therefore V_{out} = \frac{2V_{in1} + V_{in2}}{3} - \frac{2(V_{thna1} - V_{thnb1}) + (V_{thna2} - V_{thnb2})}{3}$$

In period T02, Equations (19) to (24) below hold in similar fashion.

$$I'_{a1} = \frac{1}{2} \times 4\beta_n\{(V_{out} - V'_{S1}) - V_{thna1}\}^2 \quad (19)$$

$$I'_{b1} = \frac{1}{2} \times 4\beta_n\{(V_{C1} - V'_{S1}) - V_{thnb1}\}^2 \quad (20)$$

$$I'_{a2} = \frac{1}{2}\beta_n\{(V_{out} - V'_{S2}) - V_{thna2}\}^2 \quad (21)$$

$$I'_{b2} = \frac{1}{2}\beta_n\{(V_{C1} - V'_{S2}) - V_{thnb2}\}^2 \quad (22)$$

$$I'_{a1} = I'_{b2} \quad (23)$$

$$I'_{b1} = I'_{a2} \quad (24)$$

Here $V_{S1}'$ and $V_{S2}'$ represent the common-source potentials of the first and second differential pairs in period T02, and these take on values that are different from the common-source potentials $V_{S1}$ and $V_{S2}$ of the first and second differential pairs in period T01. Further, currents Ia1', Ib1', Ia2', and Ib2' are currents that flow into the transistors Ma1, Mb1, Ma2, and Mb2, respectively, in period T02. Further, $V_{C1}$ represents the potential held by capacitor C1. This voltage value is the same as Equation (18) of the output voltage Vout that was detected and held in period T01.

If the current equations of Equations (19) and (22) are substituted into the relation of Equation (23), we have Equation (25) below.

$$(2V_{out}-2V_{S1}')-2V_{thna1}=(V_{C1}-V_{S2}')-V_{thnb2} \quad (25)$$

If the current equations of Equations (20) and (21) are substituted into the relation of Equation (24), we have Equation (26) below.

$$(2V_{C1}-2V_{S1}')-2V_{thnb1}=(V_{out}-V_{S2}')-V_{thna2} \quad (26)$$

Solving Equation (25) with regard to $V_{S2}'$ gives us Equation (27) below:

$$V_{S2}'=V_{C1}-2V_{out}+2V_{S1}'+2V_{thna1}-V_{thnb2} \quad (27)$$

If Equation (27) is substituted into Equation (26), Equation (28) below is derived.

$$2V_{C1} - 2V'_{S1} - 2V_{thnb1} = \qquad (28)$$
$$V_{out} - (V_{C1} - 2V_{out} + 2V'_{S1} + 2V_{thna1} - V_{thnb2}) - V_{thna2}$$
$$\therefore V_{out} = V_{C1} + \frac{2(V_{thna1} - V_{thnb1}) + (V_{thna2} - V_{thnb2})}{3} = \frac{2V_{in1} + V_{in2}}{3}$$

Accordingly, as indicated by Equation (28), it is possible to output a high-precision (1:2) internally divided voltage that has been compensated for offset voltage.

Figure 13:
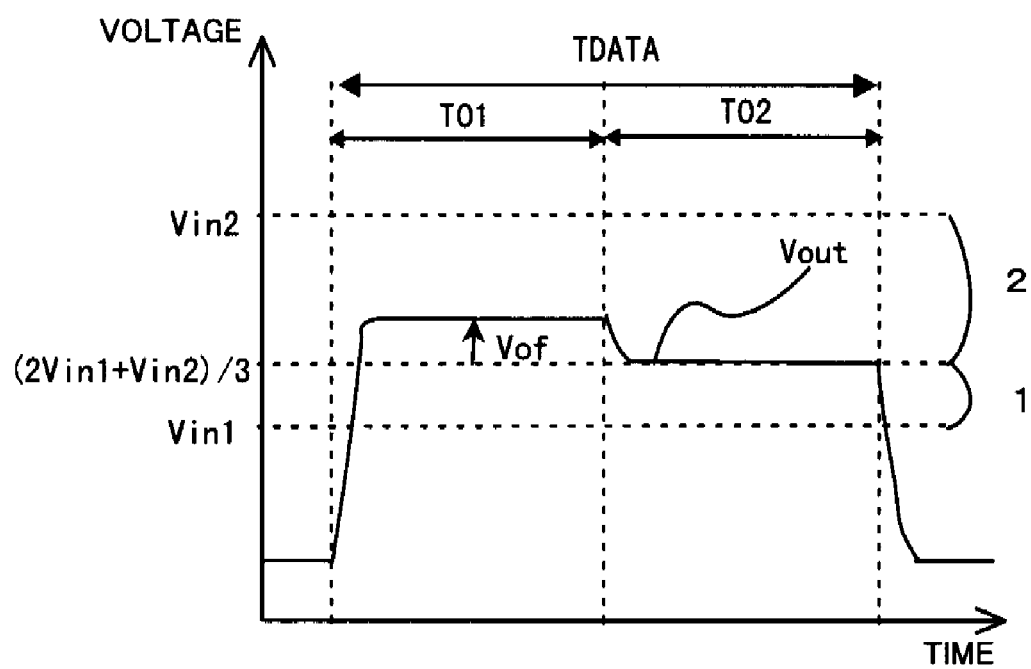
FIG. 13 is a diagram useful in describing an output voltage vs. time waveform of the differential amplifier according to the first example of the present invention.

FIG. 13 illustrates an example of the temporal transition of the output voltage waveform at the output terminal VOUT according to this example. In accordance with the operating principle described above, the output voltage Vout is made (2Vin1+Vin2)/3+Vof [see Equation 18]] in the offset detection period T01, and the offset is corrected and a voltage of (2Vin1+Vin2)/3 [see Equation (28)] is output in the offset-compensated output period T02.

In the foregoing example, the invention is described with regard to a high-voltage amplifier in which the differential amplifiers of FIG. 9 are NMOS transistors. As a matter of course, however, similar actions and effects are obtained also with regard to a low-voltage amplifier, which is a circuit configuration in which PMOS transistors are substituted for the NMOS transistors in FIG. 9. Further, although VDD and VSS are mentioned as the high- and low-potential power sources, respectively, it does not matter if these power sources are set at will so long as the potentials are low-impedance fixed potentials.

Implementation of a multi-level-output will be described next. As mentioned above, a voltage obtained by internally dividing two input voltages at (1:2) can be output with high precision. As a result, by optimizing the voltages of Vin1 and Vin2, a variety of voltages can be output in the period T02. That is, it is possible to achieve a multi-level-output in which the number of output voltages is greater than the number of input voltages.

FIGS. 14A and 14B are a diagram and table useful in describing an example of implementation of a multi-level-output by the differential amplifier (see FIG. 9) of this example. FIG. 14A depicts the relationship between input and output levels and FIG. 14B illustrates in a table format the relationship among voltage-selection states associated with 2-bit digital data (D1, D0). A case where there are two voltage levels, namely voltage levels A and B, as the input voltages, as illustrated in FIG. 14A, will be described. By selecting each of the input voltages Vin1 and Vin2 to be either voltage A or voltage B, it is possible to output four levels of Vo1 to Vo4 as the output voltages.

If (Vin1, Vin2)=(A, A) is selected in a case where voltage Vo1 is output, we have Equation (29) below in view of Equation (28) above.

$$V_{o1} = \frac{2A + A}{3} = A \qquad (29)$$

That is, voltage Vo1 becomes voltage A.

If (Vin1, Vin2)=(A, B) is selected in a case where voltage Vo2 is output, we have Equation (30) below in view of Equation (28) above.

$$V_{o2} = \frac{2A + B}{3} \qquad (30)$$

That is, voltage Vo2 is a voltage obtained by internally dividing voltage A and voltage B at (1:2).

If (Vin1, Vin2)=(B, A) is selected in a case where voltage Vo3 is output, we have Equation (31) below in view of Equation (28) above.

$$V_{o3} = \frac{2B + A}{3} \qquad (31)$$

That is, voltage Vo3 is a voltage obtained by internally dividing voltage B and voltage A at (1:2).

If (Vin1, Vin2)=(B, B) is selected in a case where voltage Vo4 is output, we have Equation (32) below in view of Equation (28) above.

$$V_{o4} = \frac{2B + B}{3} = B \qquad (32)$$

That is, voltage Vo4 becomes voltage B.

Thus, as illustrated above, in a case where the selections are made as indicated in FIG. 14A, it is possible to output voltages having four levels with respect to two input voltages. At this time the spacing between adjacent levels can be set to a fixed potential difference (B−A)/3.

Further, four voltages Vo1 to Vo4 can be selected and output by 2-bit digital data (D1, D0), as indicated in FIG. 14B. That is, the levels Vo1 to Vo4 are output in accordance with the 2-bit digital data (D1, DO)=(0,0), (0,1), (1,0) or (1,1).

FIG. 15 is a diagram illustrating the configuration of a digital-to-analog converter that uses the differential amplifier of the present invention. A circuit block 303 in FIG. 15 is a multi-level-output differential amplifier. The differential amplifier according to the example shown in FIG. 9 is used as the circuit block 303.

Here m voltages V1 to Vm selected and applied to the circuit block (multi-level-output differential amplifier) 303 are generated at the connection terminals of a plurality of resistance elements 301 serially connected between power-source voltages VA and VB. The voltages are selected by a switch group 302 and are output to the two input terminals VIN1 and VIN2.

Figure 10:
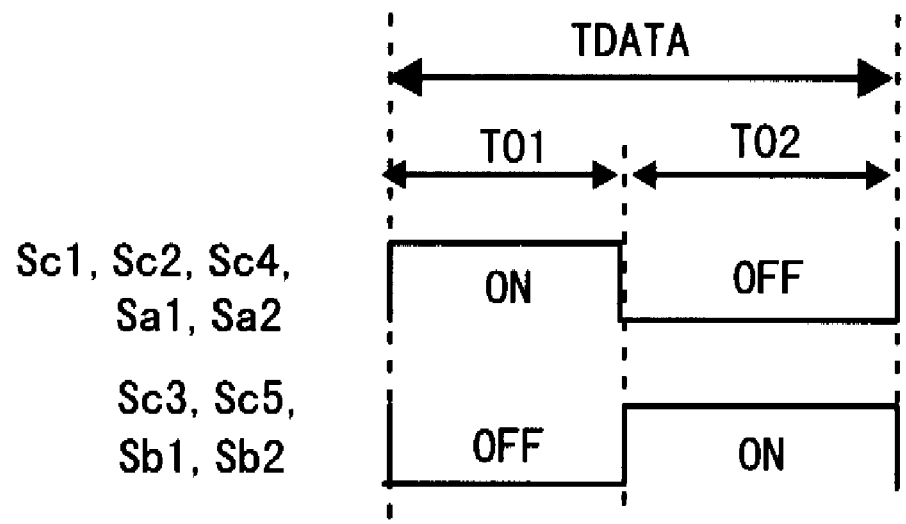
FIG. 10 is a timing chart illustrating switch control in the differential amplifier according to the first example of the present invention.

A switch control signal is supplied to the circuit block (multi-level-output differential amplifier) 303, and the switches Sc1 to Sc5, Sa1, Sa2, Sb1 and Sb2 are controlled in the manner shown in FIG. 10.

A selection signal is supplied to the switch group 302, and voltage levels conforming to the selection signal are output to the input terminals VIN1 and VIN2. A digital signal such as video data can be used as the selection signal.

As described above with reference to FIGS. 14A and 14B, the circuit block (multi-level-output differential amplifier) 303 is capable of outputting four voltage levels in dependence upon the selection conditions with regard to at least two different input voltages.

Accordingly, m voltages V1 to Vm are selected multifariously as inputs to the two input terminals VIN1 and VIN2, thereby enabling the output of a large number of voltage levels of m or more. Since a large number of output voltages can be obtained with a small number of input voltages owing to the configuration of the digital-to-analog converter of FIGS. 14A and 14B, the switches for selecting input voltages are few and the size of the circuitry can be made smaller than that of a conventional circuit having the same number of output levels.

The offset suppressing action according to this example of the present invention will be described in greater detail.

The output voltage Vout [see Equation (18)] in offset detection period T01 has a first term that is the voltage $(2V_{in1}+V_{in2})/3$ obtained by internally dividing Vin1 and Vin2 at (1:2), and a second term that is the offset term $\{(V_{thna1}-V_{thnb1})+(V_{thna2}-V_{thnb2})\}/3$.

As will be understood from perusal of the second term, i.e., the offset term, the voltage obtained by internally dividing the threshold-value deviation $(V_{thna1}-V_{thnb1})$ of the first differential pair and the threshold-value deviation $(V_{thna2}-V_{thnb2})$ of the second differential pair at (1:2) is the cause of the offset voltage.

On the other hand, in the output voltage [Equation (28)] in offset-compensated output period T02, the output potential VC1 in period T01 is the first term, and the second term is an offset voltage value whose absolute value is equal to that of the offset term in the offset detection period T01, although the sign thereof is the reverse. This term is added to the first term.

Accordingly, since the offset term [the second term of Equation (18)] in period T01 and the offset term [the second term of Equation (28)] in period T02 have equal absolute values and are opposite is sign, the offset can be corrected.

In order to comprehend the present invention, the present invention and the invention described in Patent Document 2 (Japanese Patent Kokai Publication No. JP-P2005-110065A) will be contrasted in terms of the differences between them. Patent Document 2 describes a method of correcting offset by changing over the relationship between non-inverting and inverting inputs of a differential pair. However, Patent Document 2 discloses a method of correcting offset voltage with regard to a single differential pair and, unlike the present example, is silent with regard to considerations and methods of dealing with the compounded occurrence of offset and correction of offset in a multi-level-output amplifier having a plurality of differential pairs. Further, the action of Patent Document 2 is set forth in paragraph [0031] of the specification of this document. What is described in this paragraph is solely that offset voltage $+\Delta V1$ is generated in period T01 and offset voltage $-\Delta V1$ is generated in period T02.

If offset voltage correction of two differential pairs were to be performed using the configuration of Patent Document 2, the conceivable method would be to detect the offset voltage $[-(V_{thna1}-V_{thnb1})]$ with respect to one differential pair (the first differential pair), detect the offset voltage $[-(V_{thna2}-V_{thnb2})]$ with respect to one differential pair (the second differential pair) and then, following these two offset detecting operations, change over the relationship between the non-inverting and inverting inputs of the differential pairs and output the voltage obtained by internal division.

However, since this method requires that the offset detecting operation be performed twice in one data output period, time for supplying electric charge to an external load comes under pressure and high-speed drivability represents a problem. Moreover, since two capacitors are required for one amplifier, the scale of the circuitry is enlarged.

By contrast, in the present example, in period T01, the inverting input sides are connected in common with one end of a single capacitor, whereby the example detects and holds a voltage that is the result of adding a voltage obtained by internally dividing two input voltages at (1:2) and a voltage obtained by internally dividing the threshold-value deviation between two differential pairs at (1:2).

In period T02, the potential held by the capacitor (the voltage obtained by internal division+the offset voltage produced in compounded fashion) is input commonly to all of the non-inverting inputs, thereby making it possible to correct an offset voltage [the second term in Equation (18)] produced in compounded fashion between differential pairs.

Since the offset detecting operation is performed once in one data output period in a manner similar to the offset canceling technique employed ordinarily using a capacitor, high-speed operation is possible. Since it suffices to provide only a single capacitance element per plurality of differential pairs, the above-mentioned increase in the size of the circuitry does not occur.

First Modification of First Example

FIG. 16 illustrates a modification of this example. A (1:2) internally divided voltage can be generated and output with high precision in this modification as well. Components in FIG. 16 identical with those of FIG. 9 (the first example) are designated by like reference characters and need not be described again. Only the differences will be described. In the modification illustrated in FIG. 16, the differential pair (Ma1, Mb1) is divided into two differential pairs and these are connected in parallel. That is, a differential pair (Ma11, Mb11) driven by a current source I11 and a differential pair (Ma12, Mb12) driven by a current source I12 in FIG. 16 correspond to the differential pair (Ma1, Mb1) driven by the current source I1 of FIG. 9.

An input terminal VIN11 is connected to the gate of transistor Ma11 via a switch Sa11, and the output terminal VOUT is connected to this gate via a switch Sb11. An input terminal VIN12 is connected to the gate of transistor Ma12 via a switch Sa12, and the output terminal VOUT is connected to this gate via a switch Sb12. The drains of transistors Ma11 and Ma12 are connected in common with the drain of transistor M11 of the load circuit, and the drains of transistors Mb11 and Mb12 are connected in common with the drain of transistor M12 of the load circuit. The gates of transistors Mb11, Mb12 and Mb2 are connected in common with one end of capacitor C1 and are connected to the output terminal VOUT via the switch Sc1.

The transistors M11 and M12 forming the load circuit have their sources tied together and their gates tied together, the switch Sc3 is provided between the gate and drain of transistor M11, and whether or not transistor M11 is diode-connected (i.e., whether or not its drain and gain are short-circuited) is decided by the switching of the switch Sc3.

The switch Sc2 is provided between the gate and drain of transistor M12, and whether or not transistor M12 is diode-connected is decided by the switching of the switch Sc2. The drain of transistor M11 of the load circuit is connected to the input end of the amplifier stage 703 via a switch Sc4, and the drain of transistor M12 constituting the load circuit is connected to the input end of the amplifier stage 703 via a switch Sc5.

In this modification, the size of each transistor and the amounts of current of the current sources are decided as set forth below.

If we let Wa11 and Wb11 represent the gate widths of the transistors (Ma11, Mb11) of the first differential pair, let Wa12 and Wb12 represent the gate widths of the transistors (Ma12, Mb12) of the second differential pair, let Wa2, and Wb2 represent the channel widths of the transistors (Ma2, Mb2) of the third differential pair and let the current values of the current sources I11, I12 and I2 be represented by the same symbols I11, I12 and I2, respectively, then the ratio among these quantities is defined by the relations indicated by the following equations:

$$Wa11{:}Wb11{:}Wa12{:}Wb12{:}Wa2{:}Wb2{=}1{:}1{:}11{:}11 \quad (33)$$

$$I11{:}I12{:}I2{=}1{:}1{:}1 \quad (34)$$

FIGS. 18A and 18B illustrate the results of execution of a circuit simulation using a TFT (thin-film transistor) circuit, FIGS. 18A and 18B each show the output voltage when the differential amplifier of FIG. 16 is controlled in accordance with the timing chart of FIG. 17. It was assumed in the simulation that a load (not shown) of 40 kΩ, 70 pF was connected to the output terminal as an external load.

As for the input conditions of the simulation, Vin11 and Vin12 were assumed to be identical voltages, e.g., 5.0 V, and Vin2 was assumed to be 5.3 V.

Further, FIG. 18A illustrates an output voltage waveform in a case where $V_{thna11}$, $V_{thnb11}$, $V_{thna12}$, $V_{thnb12}$, $V_{thna2}$ and $V_{thna2}$ were assumed to be the threshold voltages of transistors Ma11, Mb11, Ma12, Mb12, Ma2 and Mb2, respectively, and the threshold-value deviations ($V_{thna11}-V_{thnb11}$), ($V_{thna12}-V_{thnb12}$) and ($V_{thna2}-V_{thnb2}$) of the individual differential pairs were assumed to be 0 V ideally. Illustrated in FIG. 18B is an output voltage waveform in a case where the threshold-value deviations ($V_{thna11}-V_{thnb11}$), ($V_{thna12}-V_{thnb12}$) and ($V_{thna2}-V_{thnb2}$) of the individual differential pairs were all set to −200 mV taking into consideration a variation in characteristics due to fabrication.

In view of the results of the simulation shown in FIG. 15B, it is confirmed that in period T01, the device is affected by the average (−200 mV) of the threshold-value deviations of the transistors and a compound offset voltage (Voff) of +200 mV is superimposed upon the output voltage, and that in period T02, the compound offset voltage Voff is corrected and a (1:2) internally divided voltage (2Vin11+Vin2)/3, which is the desired valued, is output.

Accordingly, it is possible to achieve a highly precise multi-level-output also with the configuration of the modification shown in FIG. 16. Since a large number of output voltages can be obtained with a small number of input voltages using the digital-to-analog converter having the configuration shown in FIG. 15, the switches for selecting input voltages are few in number and the size of the circuitry can be made smaller than that of a conventional circuit having the same number of output levels.

Second Modification of First Example

Another modification of this example will now be described. A (1:2) internally divided voltage can be generated and output with high precision in this modification as well. In the second modification, in which use is made of a circuit configuration identical with that of FIG. 9 (the first example), the element sizes (channel widths) Wa1, Wb1, Wa2 and Wb2 of transistors Ma1 Mb1, Ma2 and Mb2, respectively, of the two differential pairs in FIG. 9 and the current values I1 and I2 of the current sources are set as follows:

$$Wa1{:}Wb1{:}Wa2{:}Wb2{=}1{:}1{:}1{:}1 \quad (35)$$

$$I1{:}I2{=}4{:}1 \quad (36)$$

FIGS. 19A and 19B illustrate the result of execution of a simulation using a TFT circuit. FIGS. 19A and 19B each show the output voltage when the differential amplifier of FIG. 9 set to the element sizes mentioned above is controlled in accordance with the timing chart of FIG. 10. It was assumed in the simulation that a load (not shown) of 40 kΩ, 70 pF was connected to the output terminal as an external load.

As for the input conditions of the simulation, Vin1 and Vin2 were assumed to be 5.0 V and 5.3 V, respectively.

Further, FIG. 19A illustrates an output voltage waveform in a case where $V_{thna1}$, $V_{thnb1}$, $V_{thna2}$ and $V_{thnb2}$ were assumed to be the threshold voltages of transistors Ma1, Mb1, Ma2 and Mb2, respectively, and the threshold-value deviations ($V_{thna1}-V_{thnb1}$) and ($V_{thna2}-V_{thnb2}$) of the individual differential pairs were assumed to be 0 V ideally. Illustrated in FIG. 19B is an output voltage waveform in a case where the threshold-value deviations of the individual differential pairs were all set to −200 mV taking into consideration a variation in characteristics due to fabrication.

In view of the results of the simulation shown in FIG. 19B, it is confirmed that in period T01, the device is affected by the average (−200 mV) of the threshold-value deviations of the transistors and a compound offset voltage (Voff) of +191 mV is superimposed upon the output voltage, and that in period T02, the compound offset voltage Voff is corrected and an internally divided voltage (5.098 V) is output.

The ideal output voltage desired as the internal voltage is 100 V. However, in period T02 according to the simulation, the fact that the offset of −2 mV remains, giving 5.098 V, is due to the fact that the actual transistor characteristics have drain-voltage dependence owing to effect of channel-length modulation and the fact that an error is produced by capacitor feed-through. An offset reducing effect is thus confirmed by the simulation, i.e., with regard to an offset voltage of 191 mV, the offset voltage after correction can be reduced to 2 mV.

Accordingly, it is possible to achieve a highly precise multi-level-output also with the configuration of this modification. Since a large number of output voltages can be obtained with a small number of input voltages using the digital-to-analog converter having the configuration shown in FIG. 15, the switches for selecting input voltages are few in number and the size of the circuitry can be made smaller than that of a conventional circuit having the same number of output levels.

Third Modification of First Example

A further modification of this example will now be described. In this modification, an internally divided voltage can be generated and output with high precision at an internal dividing ratio other than (1:2). In the third modification, in which use is made of a circuit configuration identical with that of FIG. 9 (the first example), the transistor sizes and the current values of the current sources are set as indicated below. The ratio of the gate widths Wa1, Wb1, Wa2 and Wb2 of transistors Ma1, Mb1, Ma2 and Mb2, respectively, of the two differential pairs and the current ratio of the current sources I1 and I2 are set as indicated below. Switch control is similar to that shown in FIG. 10.

$$Wa1{:}Wb1{:}Wa2{:}Wb2{=}a^2{:}a^2{:}b^2{:}b^2 \quad (37)$$

$$I_1{:}I_2{=}1{:}1 \quad (38)$$

The following Equations (39) to (44) hold in period T01:

$$I_{a1} = I_{b2} \quad (39)$$

$$I_{b1} = I_{a2} \quad (40)$$

-continued $$I_{a1} = \frac{1}{2} \times a^2 \beta_n \{(V_{in1} - V_{S1}) - V_{thna1}\}^2 \quad (41)$$

$$I_{b1} = \frac{1}{2} \times a^2 \beta_n \{(V_{out} - V_{S1}) - V_{thnb1}\}^2 \quad (42)$$

$$I_{a2} = \frac{1}{2} \times b^2 \beta_n \{(V_{in2} - V_{S2}) - V_{thna2}\}^2 \quad (43)$$

$$I_{b2} = \frac{1}{2} \times b^2 \beta_n \{(V_{out} - V_{S2}) - V_{thnb2}\}^2 \quad (44)$$

Inserting the current equations of Equations (41) and (44) into Equation (39) gives us the following equation:

$$(aV_{in1} - aV_{S1}) - aV_{thna1} = (bV_{out} - bV_{S2}) - bV_{thnb2} \quad (45)$$

Inserting the current equations of Equations (42) and (43) into Equation (40) gives us the following equation:

$$(aV_{out} - aV_{S1}) - aV_{thnb1} = (bV_{in2} - bV_{S2}) - bV_{thna2} \quad (46)$$

Solving Equation (45) with regard to $bV_{S2}$, we derive Equation (47) below.

$$bV_{S2} = bV_{out} - aV_{in1} + aV_{S1} + aV_{thna1} - bV_{thnb2} \quad (47)$$

Substituting Equation (47) into Equation (46), we have Equation (48) below.

$$aV_{out} - aV_{S1} - aV_{thnb1} = \quad (48)$$
$$bV_{in2} - (bV_{out} - aV_{in1} + aV_{S1} + aV_{thna1} - bV_{thnb2}) - bV_{thna2}$$
$$\therefore V_{out} = \frac{aV_{in1} + bV_{in2}}{a+b} - \frac{a(V_{thna1} - V_{thnb1}) + b(V_{thna2} - V_{thnb2})}{a+b}$$

Similarly, Equations (49) to (54) hold in period T02.

$$I'_{a1} = \frac{1}{2} \times a^2 \beta_n \{(V_{out} - V'_{S1}) - V_{thna1}\}^2 \quad (49)$$

$$I'_{b1} = \frac{1}{2} \times a^2 \beta_n \{(V_{C1} - V'_{S1}) - V_{thnb1}\}^2 \quad (50)$$

$$I'_{a2} = \frac{1}{2} \times b^2 \beta_n \{(V_{out} - V'_{S2}) - V_{thna2}\}^2 \quad (51)$$

$$I'_{b2} = \frac{1}{2} \times b^2 \beta_n \{(V_{C1} - V'_{S2}) - V_{thnb2}\}^2 \quad (52)$$

$$I'_{a1} = I'_{b2} \quad (53)$$

$$I'_{b1} = I'_{a2} \quad (54)$$

Here $V_{S1}'$ and $V_{S2}'$ represent the common-source potentials of the first and second differential pairs, respectively, in period T02. These take on values different from the common-source potentials $V_{S1}$ and $V_{S2}$ of the first and second differential pairs, respectively, in period T01.

Further, currents $I_{a1}'$, $I_{b1}'$, $I_{a2}'$ and $I_{b2}'$ are currents that flow into the transistors Ma1, Mb1, Ma2 and Mb2 in period T02. Further, $V_{C1}$ represents the potential held by capacitor C1. This is a voltage value identical with that of Equation (46) of output voltage Vout detected and held in period T01.

Inserting the current equations of Equations (49) and (52) into the relation of Equation (53) gives us Equation (55) below.

$$(aV_{out} - aV_{S1}') - aV_{thna1} = (bV_{C1} - bV_{S2}') - bV_{thb2} \quad (55)$$

Inserting the current equations of Equations (50) and (51) into the relation of Equation (54) gives us Equation (56) below.

$$(aV_{C1} - aV_{S1}') - aV_{thnb1} = (bV_{out} - bV_{S2}') - bV_{thna2} \quad (56)$$

Solving Equation (55) with regard to $bV_{S2}'$, we derive Equation (57) below.

$$bV_{S2}' = bV_{C1} - aV_{out} + aV_{S1}' + aV_{thna1} - bV_{thnb2} \quad (57)$$

Substituting Equation (57) into Equation (56), we have Equation (58) below.

$$aV_{C1} - aV_{S1}' - aV_{thnb1} = \quad (58)$$
$$bV_{out} - (bV_{C1} - aV_{out} + aV_{S1}' + aV_{thna1} - bV_{thnb2}) - bV_{thna2}$$
$$\therefore V_{out} = V_{C1} + \frac{a(V_{thna1} - V_{thnb1}) + b(V_{thna2} - V_{thnb2})}{a+b} = \frac{aV_{in1} + bV_{in2}}{a+b}$$

Accordingly, as indicated by Equation (58), it is possible to output an internally divided voltage obtained by any internal dividing ratio (b:a), this being a highly precise output that has been corrected for offset voltage.

When a≠b holds, therefore, four output levels can be obtained by two input voltages Vin1 and Vin2. Further, when a=b holds, the same voltage is output even if Vin1 and Vin2 are interchanged and therefore three output levels can be obtained with two input levels.

Further, when the internal dividing ratio is made (2:1) or (1:2), the output levels are spaced apart equally. However, at an internal dividing ratio other than (2:1), (1:2) or (1:1), the spacing between adjacent output levels is not an equal spacing.

In the foregoing, the invention is described with regard to a high-voltage amplifier in which the differential amplifiers of FIG. 9 are NMOS transistors. As a matter of course, however, similar actions and effects are obtained also with regard to a low-voltage amplifier, which is a circuit configuration in which PMOS transistors are substituted for the NMOS transistors in FIG. 9. Further, although VDD and VSS are mentioned as the high- and low-potential power sources, respectively, it does not matter if these power sources are set at will so long as the potentials are low-impedance fixed potentials.

It is a matter of course that by control similar to that of this example, an internally divided voltage obtained by internal division at any internal dividing ratio can be generated and output with high precision by adjusting, among a plurality of differential pairs, the ratio of element size of transistors of differential inputs to any ratio and adjusting the ratio of current values of current sources that drive the differential pairs to any ratio.

SECOND EXAMPLE

A second example of the present invention will be described with reference to the accompanying drawings in regard to implementation of a multi-level-output in a case where three input voltages are applied.

The circuit configuration of the second example of the present invention will now be described. FIG. 20 is a diagram illustrating the configuration of a differential amplifier according to the second example. The differential amplifier according to this example comprises: first differential pair (Ma1, Mb1) driven by current source 11; second differential pair (Ma2, Mb2) driven by current source 12; third differential pair (Ma3, Mb3) driven by current source 13; current mirror load circuit (M11, M12) to which the output pairs of the differential pairs are connected in common; and output-stage amplifying circuit 703.

Input terminal VIN1 is connected to the gate of one transistor Ma1 of the differential inputs of the first differential pair via switch Sa1, and the output terminal VOUT is connected to this gate via switch Sb1. Input terminal VIN2 is connected to the gate of one transistor Ma2 of the differential inputs of the second differential pair via switch Sa2, and the output terminal VOUT is connected to this gate via switch Sb2. Input terminal VIN3 is connected to the gate of one transistor Ma3 of the differential inputs of the third differential pair via switch Sa3, and the output terminal VOUT is connected to this gate via switch Sb3. The gates of the other transistors Mb1, Mb2 and Mb3 of the differential inputs of the first, second and third differential pairs are connected to one end of capacitor C1 and are connected to the output terminal VOUT via switch Sc1.

Transistors M11 and M12 constituting the load circuit have their sources tied together and their gates tied together. Switch Sc3 is provided between the gate and drain of transistor M11, and whether or not transistor M11 is diode-connected (i.e., whether or not its drain and gain are short-circuited) is decided by the switching of the switch Sc3. Switch Sc2 is provided between the gate and drain of transistor M12, and whether or not transistor M12 is diode-connected is decided by the switching of the switch Sc2. Further, the drain of transistor M11 constituting the load circuit is connected to the input of the amplifier stage 703 via switch Sc4, and the drain of transistor M12 of the load circuit is connected to the input of the amplifier stage 703 via switch Sc5.

In the second example of the present invention, the element size of each transistor and the current values of the current sources are decided as set forth below. If we let Wa1 and Wb1 represent the gate widths of transistors (Ma1, Mb1) of the first differential pair, let Wa2 and Wb2 represent the gate widths of transistors (Ma2, Mb2) of the second differential pair and let the current values of the current sources I1, I2 and I3 be represented by the same symbols I1, I2 and I3, then the ratio among these quantities is defined by the relations indicated by the following equations:

$$Wa1:Wb1:Wa2:Wb2:Wa3:Wb3=16:16:4:4:1:1 \quad (59)$$

$$I1:I2:I3=1:1:1 \quad (60)$$

FIGS. 22A and 22B illustrate the result of execution of a circuit simulation using a TFT circuit. FIGS. 22A and 22B each show the output voltage when the differential amplifier of FIG. 20 is controlled in accordance with the timing chart of FIG. 21. It was assumed in the simulation that a load (not shown) of 40 kΩ, 70 pF was connected to the output terminal as an external load.

As for the input conditions of the simulation, Vin1 was assumed to be 6.07 V, Vin2 was assumed to be 6.28 V, and Vin3 was assumed to be 6.00 V.

Further, FIG. 22A illustrates an output voltage waveform in a case where $V_{thna1}$, $V_{thnb1}$, $V_{thna2}$, $V_{thnb2}$, $V_{thna3}$ and $V_{thnb3}$ were assumed to be the threshold voltages of transistors Ma1, Mb1, Ma2, Mb2, Ma3 and Mb3, respectively, and the threshold-value deviations ($V_{thna1}-V_{thnb1}$), ($V_{thna2}-V_{thnb2}$) and ($V_{thna3}-V_{thnb3}$) of the individual differential pairs were assumed to be 0 V ideally. Illustrated in FIG. 22B is an output voltage waveform in a case where the threshold-value deviations ($V_{thna1}-V_{thnb1}$), ($V_{thna2}-V_{thnb2}$) and ($V_{thna3}-V_{thnb3}$) of the individual differential pairs were all set to −200 mV taking into consideration a variation in characteristics due to fabrication.

In view of the results of the simulation shown in FIG. 22B, it is confirmed that in period T01, the device is affected by the average (−200 mV) of the threshold-value deviations of the transistors and a compound offset voltage (Voff) of +200 mV is superimposed upon the output voltage, and that in period T02, the compound offset voltage Voff is corrected and an internally divided voltage (6.122 V) is output. The ideal output voltage desired as the weighted average value [(4×Vin1+2×Vin2+Vin3)/7] is 6.120 V. However, in period T02 according to the simulation, the fact that the offset of +2 mV remains, giving 6.122 V, is due to the fact that the actual transistor characteristics have drain-voltage dependence owing to effect of channel-length modulation and the fact that an error is produced by capacitor feed-through. An offset reducing effect is thus confirmed by the simulation, i.e., with regard to an offset voltage of 200 mV, the offset voltage after correction can be reduced to 2 mV.

Accordingly, by multifariously selecting m voltages V1 to Vm as the inputs to VIN1, VIN2 and VIN3, a large number of voltage levels of m or more can be output. In a digital-to-analog converter, therefore, a large number of output voltages can be obtained with a small number of input voltages, the switches for selecting input voltages are few in number and the size of the circuitry can be made smaller than that of a conventional circuit having the same number of output levels.

It is a matter of course that by control similar to that of this example, an internally divided voltage obtained by internal division at any internal dividing ratio can be generated and output with high precision by adjusting, among a plurality of differential pairs, the ratio of element size of transistors of differential inputs to any ratio and adjusting the ratio of current values of current sources that drive the differential pairs to any ratio. Further, although an arrangement in which amplification and output are performed by three input terminals and three voltages in this example, this does not impose a limitation. It goes without saying that in case of an arrangement having a plurality of differential pairs in which the output pairs of the differential pairs are connected in common with a load circuit, an offset that is produced in compounded form can be correction by similar control.

THIRD EXAMPLE

The circuit configuration of a third example of the present invention will now be described. FIG. 23 is a diagram showing the configuration of a differential amplifier according to the third example. For example, the differential amplifier shown in FIG. 23 employs the differential amplifier (FIG. 9) shown in the first example of the present invention. In the third example, the amplifier is further provided with an output switch SWout.

Switch control of the differential amplifier shown in FIG. 9 is carried out at the timing shown in FIG. 10. The output switch SWout in the third example is set in an OFF state in the offset detection period T01 and in an ON state in the offset-compensated output period T02.

By using the third example of FIG. 23, the amplifier stage output PB of the differential amplifier is cut off from an external (not shown) such as a data line in the offset detection period T01. As a result, the load is essentially the capacitor C1 for detecting offset, and the output potential of the differential amplifier stabilizes much more rapidly. This makes it possible to shorten the offset detection period T01.

FOURTH EXAMPLE

The circuit configuration of a fourth example of the present invention will now be described. FIG. 24 is a diagram illustrating the configuration of a differential amplifier according to the fourth example. Components in FIG. 24 identical with those shown in FIG. 9 (the first example) need not be described again; only the differences with respect to the first example will be described. In this example, a switch-noise compensating circuit 704 constituted by a switch Sc1B whose input and output ends are short-circuited is added on between the switch Sc1 and one end of the capacitor C1 (namely the point at which transistors Mb1 and Mb2 are connected in common). Switch noise produced when the switch Sc1 is turned off can be reduced by the switch-noise compensating circuit 704 comprising the switch Sc1B. Here the timings of the control signals of switches Sc1 and Sc1B must be set in an opposing-phase relationship (i.e., when one switch is ON, the other switch is OFF). FIG. 25 illustrates the timing chart of switch control of the example shown in FIG. 24.

The cause of noise when the switch is turned off is the capacitive coupling and the channel charge of the switch. In a case where electric charge flows from switch Sc1 to capacitor C1 when the switch is OFF, the potential held by capacitor C1 becomes inaccurate. This is one cause of output offset.

Examples of configurations of switches comprising transistors are illustrated in FIGS. 26A to 26C in order to describe the operation of switches Sc1 and Sc1B in detail. In FIGS. 26A, 26B and 26C, there are shown an arrangement composed solely of PMOS transistors, an arrangement composed solely of NMOS transistors, a CMOS arrangement composed of PMOS and NMOS transistors, respectively. A transistor M31 (or M41) corresponds to switch Sc1, and a transistor M32 (or M42) corresponds to switch SCB.

The differential amplifier of FIG. 24 is a high-voltage amplifier for charging up a negative charge. Since the source and drain of the switch Sc1 are in the vicinity of power source VDD rather than the power source VSS, the switches Sc1 and ScB use a PMOS switch [FIG. 26A] or CMOS switch [FIG. 26C].

Control of the switches Sc1 and Sc1B will be described next. Control will be described on the assumption that the PMOS switch circuit shown in FIG. 26A is used as the switches Sc1 and Sc1B.

In the offset detection period T01, switch Sc1 is set in an ON state and switch SCB in an ON state, and a prescribed potential that includes an offset is set in capacitor C1. Using the symbols shown in FIG. 26A, a switch control clock φ a is at the H level, a switch control clock φ b is at the L level and the drain and source of transistor M31 conduct and transistor M32 turns off. However, since the drain and source thereof are short-circuited by interconnection, the transistor M32 becomes conductive.

Next, in offset-compensated output period T02, switch Sc1 is turned off and, at the same time, switch Sc1B is turned on. Using the symbols shown in FIG. 26A, the switch control clock φ a is at the L level, the switch control clock φ b is at the H level and the drain and source of transistor M31 are rendered non-conductive. When transistor M31 undergoes a transition from the conductive to the non-conductive state, the channel charge of transistor M31 is distributed to the drain and source, the clock φ b is transmitted via the capacitive coupling of the transistor and switch noise is produced. However, since electric charge is produced from transistor M32, to which the clock φ a of the opposite phase is input, so as to cancel out the occurrence of electric charge by switch noise, the switch noise is reduced.

In general, noise can be cancelled out accurately by making the gate width of transistor M32 half the gate width of transistor M31.

In the case of FIG. 26B or FIG. 26C as well, switch noise can be suppressed and output voltage can be detected and held in the capacitance element C1 by operation similar to that described above.

Accordingly, if an arrangement of the kind shown in FIG. 24 is adopted, more precise implementation of a multi-level-output can be achieved regardless of variations in element characteristics, which are due to fabrication, and switch noise. This makes it possible to reduce the area of a digital-to-analog converter.

FIFTH EXAMPLE

A fifth example of the present invention will be described next. FIG. 27 is a diagram illustrating the configuration of a differential amplifier according to the third example. Components in FIG. 27 identical with those shown in FIG. 9 (the first example) need not be described again; only the differences with respect to the first example will be described. This example differs in that a differential amplifier stage 705 is used in the output-stage amplifying circuit. This example has a switch Sc6 provided between the drain of transistor M11 and a first input of the differential amplifier stage 705, a switch Sc7 provided between the drain of transistor M11 and a second input of the differential amplifier stage 705, a switch Sc8 provided between the drain of transistor M12 and the second input of the differential amplifier stage 705, and a switch Sc9 provided between the drain of transistor M12 and the first input of the differential amplifier stage 705.

FIG. 28 is a timing chart of switch control in the circuit of FIG. 27. Switches Sc6 and Sc8 are turned on and switches Sc7, Sc9 turned off in period T01. Switches Sc6 and Sc8 are turned off and switches Sc7, Sc9 turned off in period T02.

The relationship of the connections between the drain ends of transistors M11 and M12 and the (+) and (−) inputs of the differential amplifier stage 705 in period T01 is the reverse of that in period T02. In this example also, therefore, the offset voltage is detected by capacitor C1 and the offset voltage can be corrected by control similar to that of the first example.

SIXTH EXAMPLE

A sixth example of the present invention will be described next. FIG. 29 is a diagram illustrating the configuration of a data driver in a display device according to the sixth example, and FIG. 30 is a timing chart of control of the data driver of FIG. 29.

Figure 1:
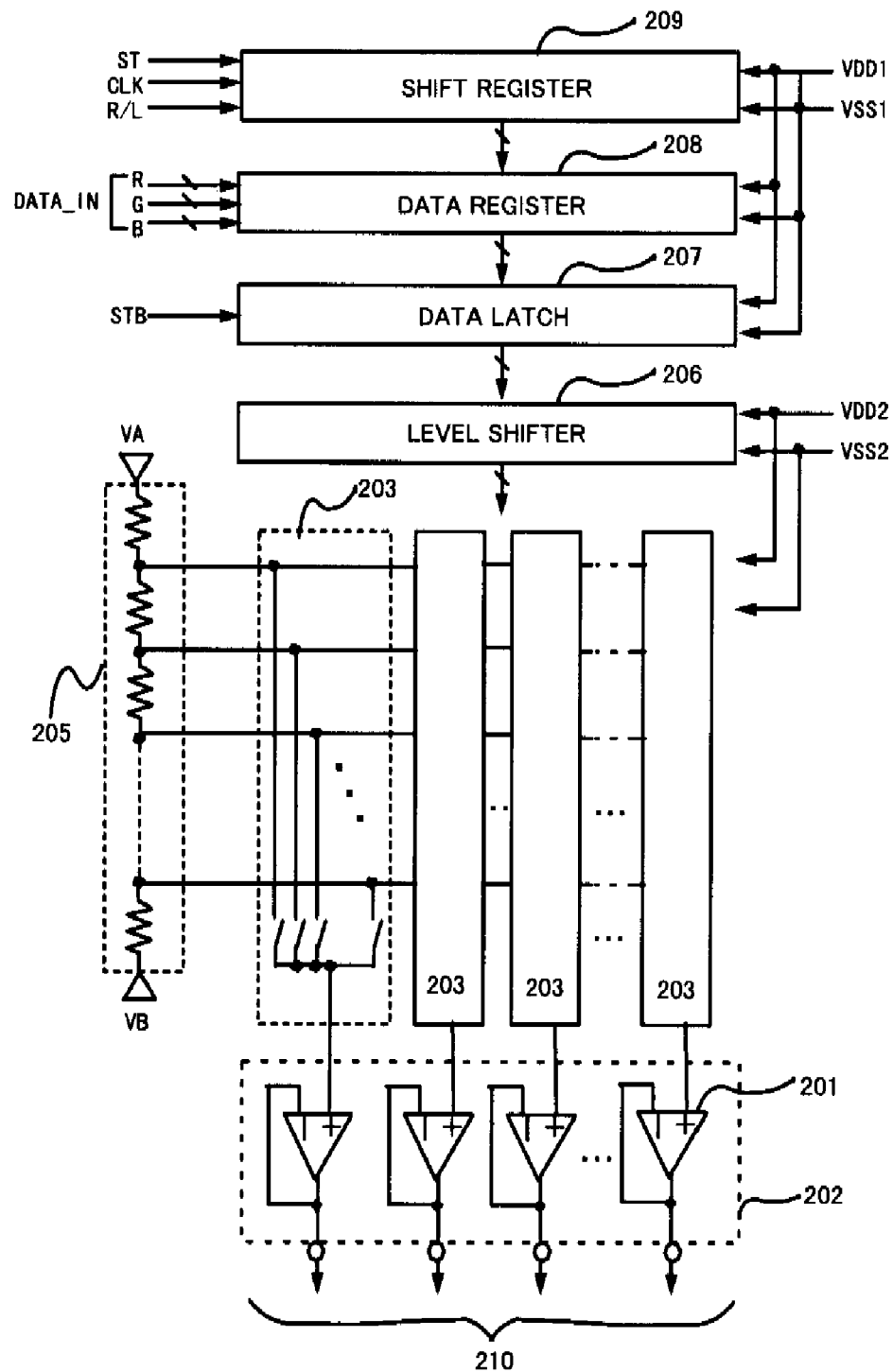
FIG. 1 is a diagram illustrating the configuration of a data driver in a liquid crystal display device according to the conventional art.
Figure 2:
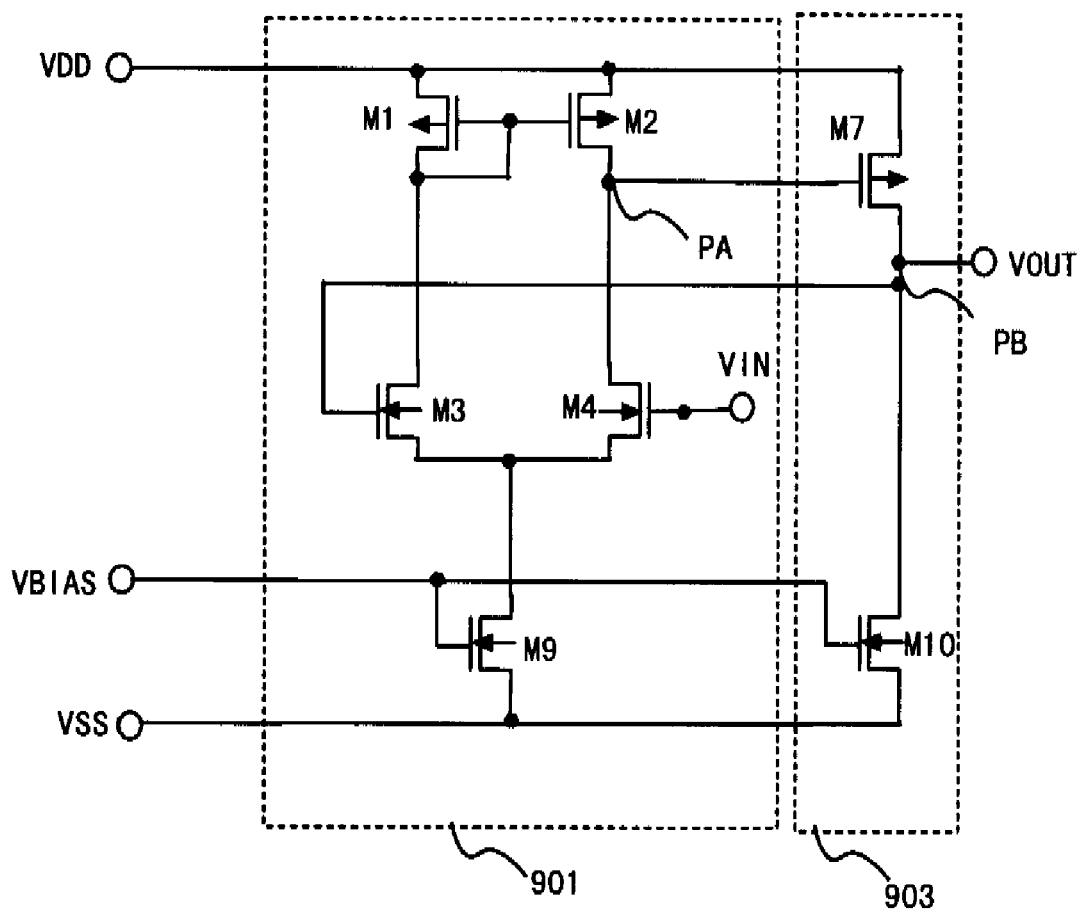
FIG. 2 is a diagram illustrating the configuration of an operational amplifier used in the conventional art.
Figure 3:
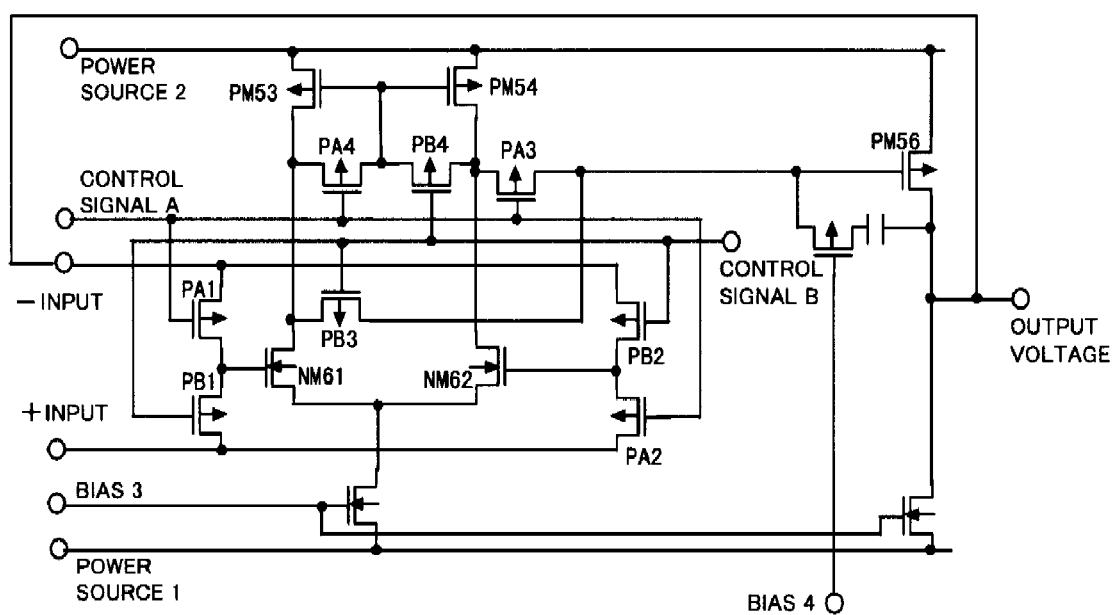
FIG. 3 is a diagram illustrating the configuration of a high-voltage amplifier described in the specification of Japanese Patent Kokai Publication No. JP-A-11-249624.
Figure 4:
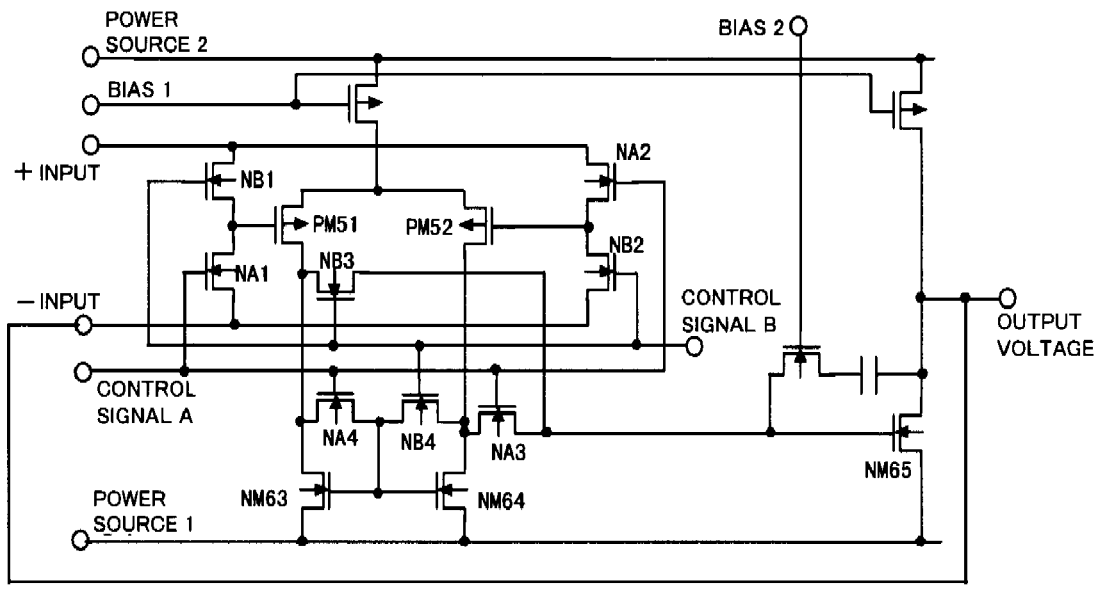
FIG. 4 is a diagram illustrating the configuration of a low-voltage amplifier described in the specification of Japanese Patent Kokai Publication No. JP-A-11-249624.
Figure 5:
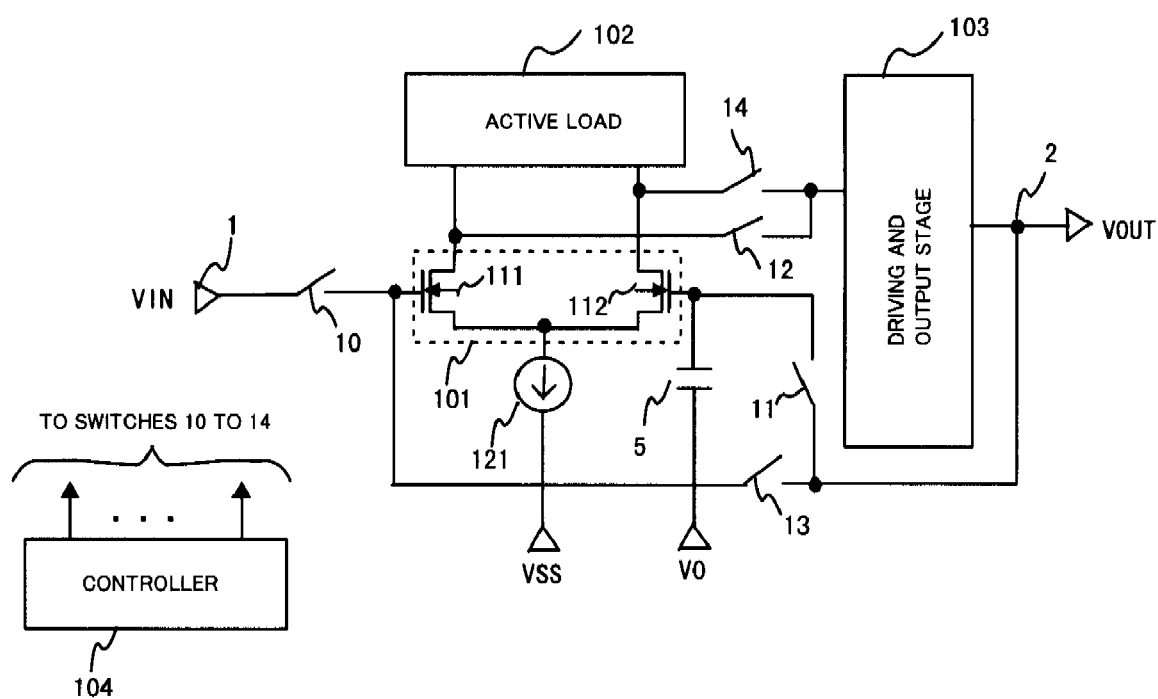
FIG. 5 is a diagram illustrating the configuration of a high-voltage offset canceling amplifier described in the specification of Japanese Patent Kokai Publication No. JP-P2005-110065A.
Figure 6:
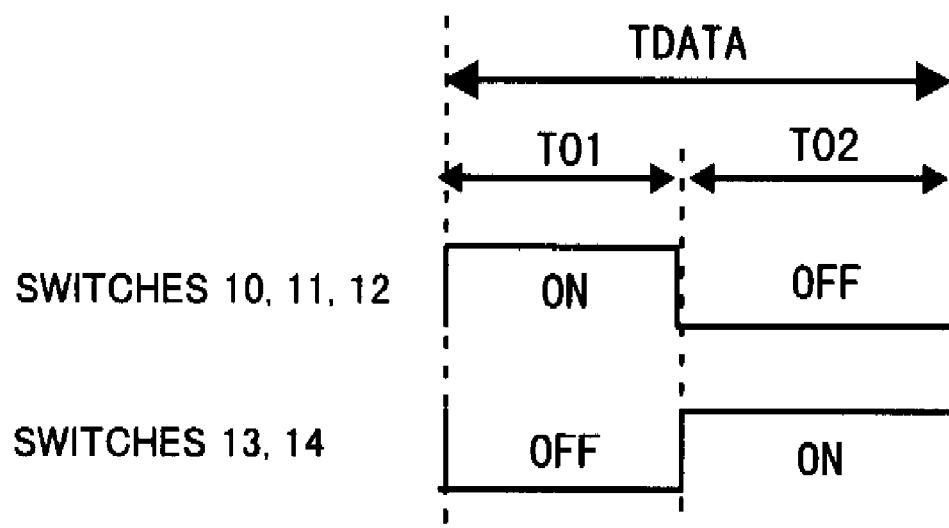
FIG. 6 is a timing chart of switch control in the offset canceling amplifier shown in FIG. 5.
Figure 7:
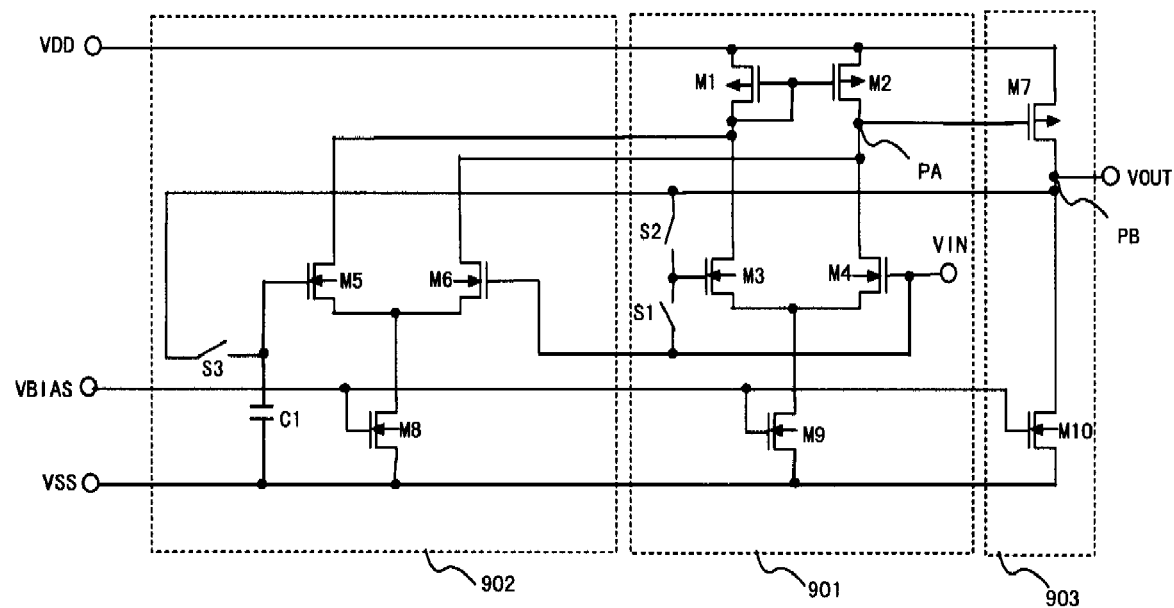
FIG. 7 is a diagram illustrating the configuration of a high-voltage offset canceling amplifier described in the specification of Japanese Patent Kokai Publication No. JP-P2001-292041A.
Figure 8:
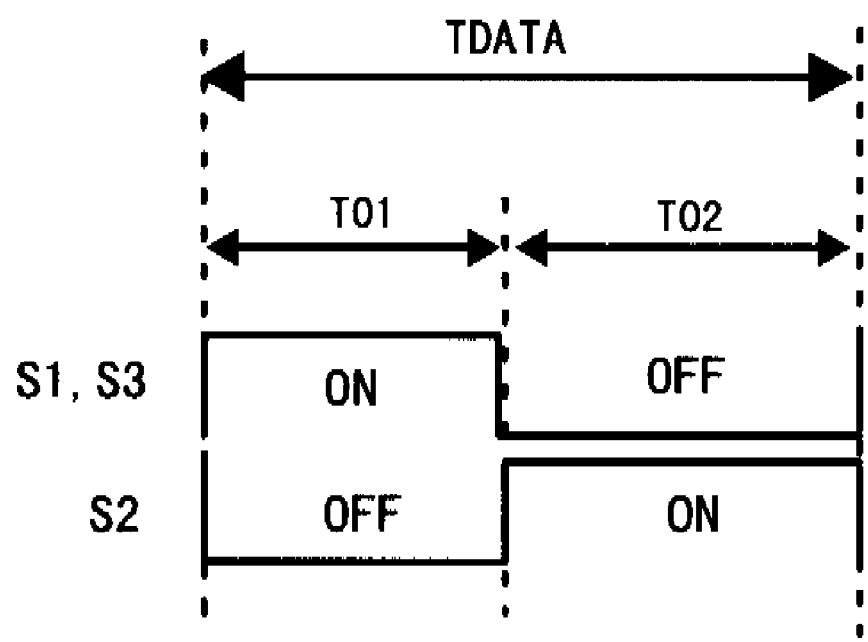
FIG. 8 is a timing chart of switch control in the offset canceling amplifier shown in FIG. 7.

This example differs from the data driver (FIG. 1) of the conventional display device in that a multi-level differential amplifier of the kind indicated by the first example of the present invention is provided as an output circuit 603, decoders 605 each of which inputs two grayscale voltages to the output circuit are provided, and an output switch circuit 604 is connected between the output circuit 603 and the output terminals of the data driver.

A positive-output differential amplifier 601 in FIG. 29 may employ, e.g., the high-voltage differential amplifier illustrated in FIG. 9, and a negative-output differential amplifier 602 may employ, e.g., a low-voltage differential amplifier may be constructed by interchanging the relationship between PMOS and NMOS and the relationship between power sources VDD and VSS in the arrangement of FIG. 9.

The positive-output differential amplifier 601 and the negative-output differential amplifier 602 in the output circuit 603 are arranged alternatingly, with each being provided on a per-data-line basis.

In a case where a liquid crystal display device is driven, the voltage impressed upon the liquid crystal generally is such that positive and negative polarities are applied alternatingly frame by frame from the standpoint of prolonging the lifetime of the liquid crystal. Furthermore, in order to obtain a high image quality by visually canceling out an imbalance in voltage applied to the liquid crystal within the liquid crystal panel, generally use is made of dot inversion drive in which positive and negative polarities are applied alternatingly for every adjacent pixel (every data line).

For this reason, the amplifiers 601 and 602 in this example are arranged alternatingly in order to apply positive and negative voltages alternatingly.

The output switch circuit 604 comprises a plurality of switches in which four switches Spa, Spb, Sna and Snb connected between output terminals of two differential amplifiers (601, 602) that take on both polarities and a group 210 of data-driver output terminals form one set. The switches Spa and Spb are switches constructed by P-channel transistors, and the switches Sna and Snb are switches constructed by N-channel transistors.

The operation of the data driver of the display device of FIG. 29 will be described with reference to the timing chart of FIG. 30. This will be described assuming use of dot inversion drive as the polarity reversing drive method of voltage applied to data lines.

Control signals illustrated in FIG. 30 include signals CTL1 and CTL2 for controlling the output switch in addition to the control signals of switches Sc1 to Sc5, Sa1, Sa2, Sb1 and SB2 illustrated in FIG. 9.

The output-switch control signals CTL1 and CTL2 are such that four phases mentioned below repeat periodically.

In a first phase (from time T1 to time Ta12 in FIG. 30), signal CTL2 takes on the L level at time T1. Signals CTL1 and CTL2 are both at the L level in this phase. Accordingly, all of the switches Spa, Spb, Sna and Snb are turned off.

In a second phase (from time Ta12 to time T2 in FIG. 30), signal CTL1 takes on the H level at time Ta12. Signal CTL2 remains at the L level. Accordingly, switches Spa and Sna are turned on, while switches Spb and Snb are turned off.

In a third phase (from time T2 to time Ta23 in FIG. 30), signal CTL1 takes on the L level at time T2. Signals CTL1 and CTL2 are both at the L level in this phase. Accordingly, all of the switches Spa Spb, Sna and Snb are turned off.

In a fourth phase (from time Ta23 to time T3 in FIG. 30), signal CTL2 takes on the H level at time Ta23. Signal CTL1 remains at the L level. Accordingly, switches Spb and Snb are turned on, while switches Spa and Sna are turned off.

By repeating the first to fourth phases periodically, the connection relationship between the output ends of differential amplifiers (601, 602) and data-driver output terminals (OUT1 to OUTn) is decided.

In the first and third phases, the output ends of the differential amplifiers (601, 602) are cut off from the data-driver output terminals (OUT1 to OUTn). The period of the first phase and the period of the third phase overlaps the offset detection period T01 exactly.

Since the offset detection period T01 essentially does not contribute to the driving of an external load (liquid crystal or data lines), all of the output switches (Spa, Spb, Sna and Snb) attain an OFF state in this period and the output of the amplifier stage stabilizes rapidly. As a result, the offset detection period T01 can be shortened.

In the second phase, the positive-output differential amplifiers (601) are connected to odd-numbered data-driver output terminals (OUT1, OUT3, OUT5, . . . ), and the negative-output differential amplifiers (602) are connected to even-numbered data-driver output terminals (OUT2, OUT4, OUT6, . . . ).

In the fourth phase, the positive-output differential amplifiers (601) are connected to even-numbered data-driver output terminals (OUT2, OUT4, OUT6, . . . ), and the negative-output differential amplifiers (602) are connected to even-numbered data-driver output terminals (OUT1, OUT3, OUT5, . . . ).

At the starting times of the second and fourth phases (Ta12 and Ta23, respectively), the offset (Vof) and the internally divided voltage [(2·Vin1+Vin2/3)] are held in capacitor C1 within the differential amplifiers (601, 602). In the second and fourth phases, therefore, a voltage that is highly accurate and obtained by internally dividing two input voltages at (1:2) is output.

Accordingly, if the data driver of the display device according to this example is used, the output switches (Spa, Spb, Sna and Snb) are turned off in the offset detection period T01, as a result of which the offset detection period can be shortened. Furthermore, in comparison with a differential amplifier referred to as a "rail-to-rail amplifier" having a differential pair of P-channel transistors and a differential pair of N-channel transistors provided within a single amplifier, the present invention shortens the time required to charge and discharge the capacitor C for the following reason:

Assume that a high voltage applied to a data line of a liquid crystal display device is 5 to 9 V and that the low voltage is 1 to 5 V. If a rail-to-rail amplifier is used in such case, the capacitor is charged and discharged to a maximum of 8 V repeatedly. However, if the arrangement in which the high-voltage differential amplifier 601 and low-voltage differential amplifier 602 are disposed alternatingly is adopted, as in the present invention, then the amplifier that applies the high voltage and the amplifier that applies the low voltage are separate amplifiers. This means that the capacitor need only be charged and discharged to a maximum of 4 V. This leads to a shorter charging and discharging time for the capacitor C1 and to a shorter offset detection period T01.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
  first to mth (where m is an integer equal to or greater than 2) input terminals;
  an output terminal;
  first to mth differential pairs;
  a current source circuit that supplies currents to respective ones of said first to mth differential pairs;
  a first node connected in common with first outputs of each of output pairs of said first to mth differential pairs;

a second node connected in common with second outputs of each of output pairs of said first to mth differential pairs;

a load circuit connected to said first and second nodes;

an amplifier stage that receives a signal from at least one node of said first and second nodes as an input and has an output end connected to said output terminal;

a capacitance element; and a changeover circuit that controls changeover between a first connection state and a second connection state, responsive to a control signal supplied thereto; wherein in said first connection state, a first input of each input pair of said first to mth differential pairs is made a non-inverting input and a second input of each input pair of said first to mth differential pairs is made an inverting input, the first inputs of the input pairs of said first to mth differential pairs are connected to respective ones of said first to mth input terminals, and the second inputs of the input pairs of said first to mth differential pairs are connected in common with one end of said capacitance element and in common with said output terminal; and in said second connection state, the first input of each input pair of said first to mth differential pairs is made an inverting input and a second input of each input pair of said first to mth differential pairs is made a non-inverting input, the first inputs of the input pairs of said first to mth differential pairs are connected in common with said output terminal, and the second inputs of the input pairs of said first to mth differential pairs are connected to the one end of said capacitance element;

a first period in which the first connection state is selected and a second period which follows the first period and in which the second connection state is selected forming a data output period.

2. The differential amplifier according to claim 1, wherein, in the first period, responsive to the control signal, first to mth input voltages (Vin1, Vin2, . . . , Vinm) are applied to the first inputs of the input pairs of said first to mth differential pairs, respectively, and a voltage that is the result of adding a voltage obtained by weighting and averaging the first to mth input voltages at prescribed ratios (a1, a2, . . . , am) and an offset voltage ascribable to said first to mth differential pairs is applied to the one end of said capacitance element, as expressed by the following equation:

$$Vout = \frac{a1 \cdot Vin1 + a2 \cdot Vin2 + \ldots + am \cdot Vinm}{a1 + a2 + \ldots + am} + Vof,$$

where Vin1, Vin2, , and Vinm are input voltages, a1, a2, . . . , and am are weightings of the respective input voltages, and Vof is the offset voltage; and in the second period, responsive to the control signal, a voltage that has been stored in said capacitance element is applied to the second inputs of the input pairs of said first to mth differential pairs, the offset voltage is corrected, and a voltage obtained by weighting and averaging the first to mth input voltages (Vin1, Vin2, . . . , Vinm) at the prescribed ratio, as expressed by the following equation:

$$Vout = \frac{a1 \cdot Vin1 + a2 \cdot Vin2 + \ldots + am \cdot Vinm}{a1 + a2 + \ldots + am}$$

is output.

3. The differential amplifier according to claim 1, wherein said current source circuit comprises first to mth current sources for supplying currents to respective ones of said first to mth differential pairs.

4. The differential amplifier according to claim 3, wherein a ratio of channel widths of transistors constructing said first to mth differential pairs is made $a1^2:a2^2:am^2$; and a ratio of current values of said first to mth current sources is made $1:1: \ldots :1$.

5. The differential amplifier according to claim 1, wherein said current source circuit comprises a single current source for supplying current to all of said first to mth differential pairs.

6. The differential amplifier according to claim 5, wherein a ratio of channel widths of transistors constructing said first to mth differential pairs is made $a1^2:a2^2: \ldots :am^2$.

7. The differential amplifier according to claim 1, wherein said changeover circuit includes:

first to mth input switches that perform on-and-off control of connections between the first inputs of the input pairs of said first to mth differential pairs and said first to mth input terminals, respectively;

first to mth negative-feedback connection switches that perform on-and-off control of connections between said output terminal and the respective first inputs of the input pairs of said first to mth differential pairs; and a first switch that performs on-and-off control of a connection between one end of said capacitance element and said output terminal.

8. The differential amplifier according to claim 7, wherein in the first period, responsive to the control signal, said first to mth input switches are set in an ON state, said first to mth negative-feedback connection switches are set in an OFF state, said first switch is set in an ON state, and said output terminal is connected to one end of said capacitance element via said first switch; and in the second period, responsive to the control signal, said first to mth input switches are set in an OFF state, said first to mth negative-feedback connection switches are set in an ON state, said first switch is set in an OFF state, the second inputs of the input pairs of said first to mth differential pairs are connected in common with one end of said capacitance element, and said output terminal is connected to the first inputs of the input pairs of said first to mth differential pairs via said first to mth negative-feedback connection switches.

9. The differential amplifier according to claim 1, wherein said changeover circuit includes:

a fourth switch for performing on-and-off control of a connection between said first node and the input end of said amplifier stage, and a fifth switch for performing on-and-off control of a connection between said second node and the input end of said amplifier stage.

10. The differential amplifier according to claim 9, wherein in the first period, responsive to the control signal, said fifth switch is turned off and said first node is connected to the input end of said amplifier stage via said fourth switch, which is in an ON state; and in the second period, responsive to the control signal, said fourth switch is turned off and said second node is connected to the input end of said amplifier stage via said fifth switch, which is in an ON state.

11. The differential amplifier according to claim 1, wherein said amplifier stage includes:

a differential amplifier stage;

a sixth switch that performs on-and-off control of a connection between said first node and a first input of an input pair of said differential amplifier stage;

a seventh switch that performs on-and-off control of a connection between said first node and a second input of the input pair of said differential amplifier stage;

an eighth switch that performs on-and-off control of a connection between said second node and the second input of the input pair of said differential amplifier stage; and a ninth switch that performs on-and-off control of a connection between said second node and the first input of the input pair of said differential amplifier stage.

12. The differential amplifier according to claim 11, wherein in the first period, responsive to the control signal, said seventh and ninth input switches are set in an OFF state, said first node is connected to the first input of the input pair of said differential amplifier stage via said sixth switch, which is in an ON state, and said second node is connected to the second input of the input pair of said differential amplifier stage via said eighth switch, which is in an ON state; and in the second period, responsive to the control signal, said sixth and eighth input switches are set in an OFF state, said second node is connected to the first input of the input pair of said differential amplifier stage via said ninth switch, which is in an ON state, and said first node is connected to the second input of the input pair of said differential amplifier stage via said seventh switch, which is in an ON state.

13. The differential amplifier according to claim 1, wherein said load circuit includes a current mirror circuit, and wherein changeover is controlled by the control signal in such a manner that in the first period, said first node is connected to an output of the current mirror circuit and said second node is connected to an input of the current mirror circuit, and in the second period, said first node is connected to the input of the current mirror circuit and the second node is connected to the output of the current mirror circuit.

14. The differential amplifier according to claim 1, wherein said load circuit includes:

first and second transistors that constitute a current mirror circuit and have sources connected in common to a power source and gate coupled together;

a third switch that performs on-and-off control of a connection between the gate and drain of said first transistor; and a second switch that performs on-and-off control of a connection between the gate and drain of said second transistor;

the drains of said first and second transistors being connected to said first and second nodes, respectively; wherein in the first period, responsive to the control signal, said third switch is set in an OFF state and said second switch is set in an ON state, whereby said second transistor is diode-connected and said second and first nodes are made the input and output, respectively, of the current mirror circuit; and in the second period, responsive to the control signal, said second switch is set in an OFF state and said third switch is set in an ON state, whereby said first transistor is diode-connected and said first and second nodes are made the input and output, respectively, of the current mirror circuit.

15. The differential amplifier according to claim 1, further comprising an output switch that performs on-and-off control of a connection between said output terminal and an external load;

said output switch being turned by the control signal in the first period.

16. The differential amplifier according to claim 7, wherein said first switch that performs on-and-off control of the connection between one end of said capacitance element and said output terminal has a third transistor;

said differential amplifier includes a fourth transistor that has source and drain short-circuited between the drain or source of said third transistor and one end of said capacitance element;

a first control signal is supplied to the gate of said third transistor;

a second control signal is supplied to the gate of said fourth transistor; and the second control signal is a signal that is the inverse of the first control signal.

17. A digital-to-analog converter comprising:

a differential amplifier set forth in claim 1;

a resistor string including a plurality of resistance elements connected serially between a first potential on a high-potential side and a second potential on a low-potential side; and a selecting circuit which receives potentials from taps of said resistor string and selects input voltages, which are to be supplied to a plurality of the input terminals, based upon a selection signal.

18. A display device having an amplifying circuit that drives a data line connected to a display element, wherein said display device has the differential amplifier set forth in claim 1 as said amplifying circuit.

19. A display device including:

a first data line and a second data line adjacent to said first data line;

a first differential amplifier for charging and a second differential amplifier for discharging, each of said first and second differential amplifier being the differential amplifier as set forth in claim 1;

first and second output switches arranged between an output of said first differential amplifier and said first and second data lines, respectively;

third and fourth output switches arranged between an output of said second differential amplifier and said first and second data lines, respectively;

wherein said second and third output switches are set in an OFF state and said first and fourth output switches are set in an ON state in a prescribed data output period; and said first and fourth output switches are set in an OFF state and said second and third output switches are set in an ON state in a data output period that follows the prescribed data output period.

20. A display device including:
a first data line and a second data line adjacent to said first data line;
a first differential amplifier for charging and a second differential amplifier for discharging, each of said first and second differential amplifier being the differential amplifier as set forth in claim 1;
first and second output switches arranged between an output of said first differential amplifier and said first and second data lines, respectively;
third and fourth output switches arranged between an output of said second differential amplifier and said first and second data lines, respectively; wherein
control is exercised in such a manner that in a prescribed data output period, said second and third output switches are set in an OFF state and said first and fourth output switches are set in an ON state after being placed in an OFF state for a prescribed period of time from start of the data output period; and
control is exercised in such a manner that in a data output period that follows the prescribed data output period, said first and fourth output switches are set in an OFF state and said second and third output switches are set in an ON state after being placed in an OFF state for a prescribed period of time from start of the data output period.

21. A differential amplifier comprising:
first and second input terminals;
an output terminal;
first and second differential pairs;
a current source circuit that supplies currents to respective ones of said first and second differential pairs;
a first node connected in common with first outputs of each of output pairs of said first and second differential pairs;
a second node connected in common with second outputs of each of output pairs of said first and second differential pairs;
a load circuit connected to said first and second nodes;
an amplifier stage that receives a signal from at least one node of said first and second nodes as an input and has an output end connected to said output terminal;
a capacitance element; and
a changeover circuit that controls changeover between a first connection state and a second connection state, responsive to a control signal input thereto, wherein
in said first connection state,
a first input of each input pair of said first and second differential pairs is made a non-inverting input and a second input of each input pair of said first and second differential pairs is made an inverting input,
the first input of the input pair of said first differential pair is connected to said first input terminal,
the first input of the input pair of said second differential pair is connected to said second input terminal, and
the second inputs of the input pairs of said first and second differential pairs are connected in common with one end of said capacitance element and in common with said output terminal; and
in said second connection state,
the first input of each input pair of said first and second differential pairs is made an inverting input and a second input of each input pair of said first and second differential pairs is made a non-inverting input,
the first inputs of the input pairs of said first and second differential pairs are connected in common with said output terminal, and
the second inputs of the input pairs of said first and second differential pairs are connected to the one end of said capacitance element;
a first period in which the first connection state is selected and a second period which follows the first period and in which the second connection state is selected forming a data output period.

22. The differential amplifier according to claim 21, wherein
changeover is controlled by the control signal in such a manner that
in the first period,
first and second input voltages (Vin1, Vin2) are applied to the first inputs of the input pairs of said first and second differential pairs, respectively, and
a voltage that is the result of adding a voltage obtained by internally dividing the first and second input voltages at a ratio (a2:a1) and an offset voltage ascribable to said first and second differential pairs is stored at one end of said capacitance element, as expressed by the following equation:

$$Vout = \frac{a1 \cdot Vin1 + a2 \cdot Vin2}{a1 + a2} + Vof,$$

where Vin1 and Vin2 are input voltages,
a1 and a2 are weightings of the respective input voltages, and
Vof is the offset voltage; and
in the second period,
a voltage that has been stored in said capacitance element is input in common to all of the second inputs of the input pairs of said first and second differential pairs,
the offset voltage is corrected, and
a voltage obtained by internally dividing the two input voltages at the prescribed ratio (a2:a1), as expressed by the following equation:

$$Vout = \frac{a1 \cdot Vin1 + a2 \cdot Vin2}{a1 + a2}$$

is output.

23. The differential amplifier according to claim 21, wherein
said current source circuit comprises a first current source for supplying current to said first differential pair and a second current source for supplying current to said first second differential pair.

24. The differential amplifier according to claim 23, wherein
a ratio of channel width of transistors constructing said first differential pair and channel width of transistors constructing said second differential pair is made $a1^2:a2^2$; and
a ratio of current values of said first and second current sources is made 1:1.

25. The differential amplifier according to claim 21, wherein
said changeover circuit includes:
a first input switch that performs on-and-off control of a connection between the first input of the input pair of said first differential pair and said first terminal;
a second input switch that performs on-and-off control of a connection between the first input of the input pair of said second differential pair and said second terminal;
a first negative-feedback connection switch that performs on-and-off control of a connection between said output terminal and the first input of the input pair of said first differential pair;
a second negative-feedback connection switch that performs on-and-off control of a connection between said output terminal and the first input of the input pair of said second differential pair; and
a first switch that performs on-and-off control of a connection between one end of said capacitance element and said output terminal.

26. The differential amplifier according to claim 25, wherein
in the first period, responsive to the control signal,
said first and second input switches are set in an ON state,
said first and second negative-feedback connection switches are set in an OFF state,
said first switch is set in an ON state, and
said output terminal is connected to the one end of said capacitance element via said first switch; and
in the second period, responsive to the control signal,
said first and second input switches are set in an OFF state,
said first and second negative-feedback connection switches are set in an ON state,
said first switch is set in an OFF state,
the second inputs of the input pairs of said first and second differential pairs are connected in common with the one end of said capacitance element, and
said output terminal is connected to the first inputs of the input pairs of said first and second differential pairs via said first and second negative-feedback connection switches.

27. The differential amplifier according to claim 22, wherein the internal dividing ratio is made 1:2 or 2:1; and
a voltage value obtained by adding a voltage that is twice one of the first and second input voltages and the other voltage of the first and second voltages is made three times the output voltage in the second period.

28. The differential amplifier according to claim 27, wherein a ratio of channel width of transistors constructing said first differential pair and channel width of transistors constructing said second differential pair is made 4:1 or 1:4, and a ratio of current values of the two current sources is made 1:1.

29. A differential amplifier comprising:
first and second input terminals;
an output terminal;
first to third differential pairs;
first to third current source circuits that supply currents individually to respective ones of said first to third differential pairs;
a first node forming a common connection node of first outputs of each of output pairs of said first to third differential pairs;
a second node forming a common connection node of second outputs of each of output pairs of said first and second differential pairs;
a load circuit connected to said first and second nodes;
an amplifier stage that receives a signal from at least one node of said first and second nodes as an input and has an output end connected to said output terminal;
a single capacitance element; and
a changeover circuit that controls changeover between a first connection state and a second connection state, responsive to a control signal supplied thereto; wherein
first and second input voltages of mutually different voltage values are applied to said first and second input terminals, respectively;
element sizes of said first to third differential pairs are all made identical;
current quantities of said first to third current sources are all made identical; and
first inputs of input pairs of said first and second differential pairs are connected together and second inputs of input pairs of said first and second differential pairs are connected together; and wherein
in said first connection state,
a first input of each input pair of said first to third differential pairs is made a non-inverting input and a second input of each input pair of said first to third differential pairs is made an inverting input,
the first input voltage is applied to the first inputs of said first and second differential pairs,
the second input voltage is applied to the first input of said first third differential pair, and
the second inputs of the input pairs of said first to third differential pairs are connected in common with one end of said capacitance element and in common with said output terminal; and
in the second connection state,
a first input of each input pair of said first to third differential pairs is made an inverting input and a second input of each input pair of said first to third differential pairs is made a non-inverting input,
the first inputs of the input pairs of said first to third differential pairs are connected in common with said output terminal,
the second inputs of the input pairs of said first to third differential pairs are connected in common with one end of said capacitance element, and
a voltage obtained by internally dividing the first and second input voltages at 1:2 is amplified and output;
a first period in which the first connection state is selected and a second period which follows the first period and in which the second connection state is selected forming a data output period.

* * * * *